(12) United States Patent
Mokhlesi

(10) Patent No.: US 7,606,070 B2
(45) Date of Patent: *Oct. 20, 2009

(54) SYSTEMS FOR MARGINED NEIGHBOR READING FOR NON-VOLATILE MEMORY READ OPERATIONS INCLUDING COUPLING COMPENSATION

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 11/618,624

(22) Filed: Dec. 29, 2006

(65) Prior Publication Data

US 2008/0158985 A1  Jul. 3, 2008

(51) Int. Cl.
*G11C 16/04* (2006.01)

(52) U.S. Cl. ............... 365/185.17; 365/185.18; 365/185.21; 365/185.23

(58) Field of Classification Search ........... 365/185.17, 365/185.18, 185.21, 185.23, 185.24, 185.03
See application file for complete search history.

(56) References Cited

U.S. PATENT DOCUMENTS

| | | | |
|---|---|---|---|
| 5,532,962 | A | 7/1996 | Auclair et al. |
| 5,539,690 | A | 7/1996 | Talreja |
| 5,657,332 | A | 8/1997 | Auclair |
| 5,764,572 | A | 6/1998 | Hammick |
| 5,781,478 | A | 7/1998 | Takeuchi et al. |
| 5,862,074 | A | 1/1999 | Park |
| 5,867,429 | A | 2/1999 | Chen et al. |
| 5,943,260 | A | 8/1999 | Hirakawa |
| 5,946,231 | A | 8/1999 | Endoh |
| 5,995,417 | A | 11/1999 | Chen |
| 6,044,019 | A | 3/2000 | Cernea |
| 6,046,935 | A | 4/2000 | Takeuchi et al. |
| 6,107,658 | A | 8/2000 | Itoh |
| 6,144,580 | A | 11/2000 | Murray |

(Continued)

FOREIGN PATENT DOCUMENTS

DE  10164149  7/2002

(Continued)

OTHER PUBLICATIONS

Aritome, "Reliability Issues of Flash Memory Cells," Proceedings of the IEEE, IEEE, New York, vol. 81, No. 5, May 1, 1993.

(Continued)

*Primary Examiner*—David Lam
(74) *Attorney, Agent, or Firm*—Vierra Magen Marcus & DeNiro LLP

(57) ABSTRACT

Shifts in the apparent charge stored on a floating gate (or other charge storing element) of a non-volatile memory cell can occur because of the coupling of an electric field based on the charge stored in adjacent floating gates (or other adjacent charge storing elements). The problem occurs most pronouncedly between sets of adjacent memory cells that have been programmed at different times. To account for this coupling, the read process for a particular memory cell will provide compensation to an adjacent memory cell in order to reduce the coupling effect that the adjacent memory cell has on the particular memory cell. When reading the adjacent cell to determine the appropriate compensation, margined read voltages can be used.

31 Claims, 24 Drawing Sheets

U.S. PATENT DOCUMENTS

| | | |
|---|---|---|
| 6,154,157 A | 11/2000 | Wong |
| 6,160,739 A | 12/2000 | Wong |
| 6,175,522 B1 | 1/2001 | Fang |
| 6,212,101 B1 | 4/2001 | Lee |
| 6,222,762 B1 | 4/2001 | Guterman et al. |
| 6,259,632 B1 | 7/2001 | Khouri et al. |
| 6,285,593 B1 | 9/2001 | Wong |
| 6,345,000 B1 | 2/2002 | Wong |
| 6,349,055 B1 | 2/2002 | Murray |
| 6,363,014 B1 | 3/2002 | Fastow |
| 6,411,548 B1 | 6/2002 | Sakui et al. |
| 6,418,061 B1 | 7/2002 | Kitazaki |
| 6,462,988 B1 | 10/2002 | Harari |
| 6,522,580 B2 | 2/2003 | Chen et al. |
| 6,532,556 B1 | 3/2003 | Wong |
| 6,535,423 B2 | 3/2003 | Trivedi et al. |
| 6,542,407 B1 | 4/2003 | Chen et al. |
| 6,570,785 B1 | 5/2003 | Mangan |
| 6,570,790 B1 | 5/2003 | Harari |
| 6,614,070 B1 | 9/2003 | Hirose |
| 6,643,188 B2 | 11/2003 | Tanaka et al. |
| 6,657,891 B1 | 12/2003 | Shibata et al. |
| 6,717,847 B2 | 4/2004 | Chen |
| 6,717,851 B2 | 4/2004 | Mangan |
| 6,760,068 B2 | 7/2004 | Petropoulos et al. |
| 6,771,536 B2 | 8/2004 | Li et al. |
| 6,781,877 B2 | 8/2004 | Cernea et al. |
| 6,807,095 B2 | 10/2004 | Chen et al. |
| 6,870,766 B2 | 3/2005 | Cho et al. |
| 6,870,768 B2 | 3/2005 | Cernea et al. |
| 6,956,770 B2 | 10/2005 | Khalid et al. |
| 6,975,538 B2 | 12/2005 | Abedifard |
| 7,006,379 B2 | 2/2006 | Noguchi et al. |
| 7,009,881 B2 | 3/2006 | Noguchi |
| 7,020,017 B2 | 3/2006 | Chen |
| 7,085,167 B2 | 8/2006 | Lee et al. |
| 7,184,308 B2 * | 2/2007 | Kwon et al. ............ 365/185.17 |
| 7,233,522 B2 | 6/2007 | Chen et al. |
| 7,262,995 B2 | 8/2007 | Kim |
| 7,310,272 B1 * | 12/2007 | Mokhlesi et al. ....... 365/185.22 |
| 7,349,265 B2 * | 3/2008 | Crippa et al. .......... 365/185.21 |
| 2002/0051383 A1 | 5/2002 | Mangan |
| 2002/0126532 A1 | 9/2002 | Matsunaga |
| 2003/0112663 A1 | 6/2003 | Quader |
| 2003/0128586 A1 | 7/2003 | Chen |
| 2003/0137888 A1 | 7/2003 | Chen |
| 2003/0161182 A1 | 8/2003 | Li et al. |
| 2003/0218920 A1 | 11/2003 | Harari |
| 2004/0019737 A1 | 1/2004 | Kastoriano et al. |
| 2004/0027865 A1 | 2/2004 | Mangan |
| 2004/0042270 A1 | 3/2004 | Huang |
| 2004/0047182 A1 | 3/2004 | Cernea et al. |
| 2004/0057283 A1 | 3/2004 | Cernea |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea |
| 2004/0079988 A1 | 4/2004 | Harari |
| 2004/0080980 A1 | 4/2004 | Lee |
| 2004/0109357 A1 | 6/2004 | Cernea et al. |
| 2004/0190337 A1 | 9/2004 | Chen |
| 2004/0213031 A1 | 10/2004 | Hosono |
| 2005/0057967 A1 | 3/2005 | Khalid |
| 2005/0162913 A1 | 7/2005 | Chen |
| 2006/0120161 A1 | 6/2006 | Confalonieri |
| 2006/0221692 A1 | 10/2006 | Chen |
| 2007/0047314 A1 | 3/2007 | Goda |
| 2007/0206421 A1 | 9/2007 | Mokhlesi |
| 2007/0206426 A1 | 9/2007 | Mokhlesi |
| 2007/0242510 A1 | 10/2007 | Hermink |
| 2007/0279994 A1 | 12/2007 | Mokhlesi |
| 2008/0158946 A1 | 7/2008 | Mokhlesi |
| 2008/0158974 A1 | 7/2008 | Mokhlesi |
| 2008/0158984 A1 * | 7/2008 | Mokhlesi ............... 365/185.21 |

FOREIGN PATENT DOCUMENTS

| | | |
|---|---|---|
| EP | 01271553 | 1/2003 |
| EP | 01329898 | 1/2003 |
| WO | WO03025512 | 3/2003 |
| WO | WO2005073978 | 8/2005 |
| WO | WO2005104135 | 11/2005 |
| WO | WO2006107731 | 10/2006 |
| WO | WO2007078793 | 7/2007 |
| WO | WO2007089370 | 8/2007 |
| WO | WO2007103038 | 9/2007 |

OTHER PUBLICATIONS

International Search Report & The Written Opinion of the International Searching Authority, Patent Cooperation Treaty, Application No. PCT/US2007/088899 filed on Dec. 27, 2007, Jun. 23, 2008.

Notice of Allowance and Fee(s) Due, United States Patent & Trademark Office, U.S. Appl. No. 11/618,616, filed Dec. 29, 2006, May 16, 2008.

Notice of Allowance and Fee(s) Due, United States Patent & Trademark Office, U.S. Appl. No. 11/618,616, filed Dec. 29, 2006, Oct. 15, 2008.

* cited by examiner

| Wordline | all bit lines |
|---|---|
| WL3 | Page 3 |
| WL2 | Page 2 |
| WL1 | Page 1 |
| WL0 | Page 0 |

Fig. 11A

| Wordline | Even Bit Lines | Odd Bit Lines |
|---|---|---|
| WL3 | Page 6 | Page 7 |
| WL2 | Page 4 | Page 5 |
| WL1 | Page 2 | Page 3 |
| WL0 | Page 0 | Page 1 |

Fig. 11B

| Wordline | Upper/Lower Page | All Bit Lines |
|---|---|---|
| WL3 | upper | Page 7 |
| WL3 | lower | Page 6 |
| WL2 | upper | Page 5 |
| WL2 | lower | Page 4 |
| WL1 | upper | Page 3 |
| WL1 | lower | Page 2 |
| WL0 | upper | Page 1 |
| WL0 | lower | Page 0 |

Fig. 11C

| Wordline | Upper/Lower Page | Even Bit Lines | Odd Bit Lines |
|---|---|---|---|
| WL3 | upper | Page 14 | Page 15 |
| WL3 | lower | Page 12 | Page 13 |
| WL2 | upper | Page 10 | Page 11 |
| WL2 | lower | Page 8 | Page 9 |
| WL1 | upper | Page 6 | Page 7 |
| WL1 | lower | Page 4 | Page 5 |
| WL0 | upper | Page 2 | Page 3 |
| WL0 | lower | Page 0 | Page 1 |

Fig. 11D

| Wordline | Upper/ Lower Page | Even Bit Lines | Odd Bit Lines |
|---|---|---|---|
| WL3 | upper | Page 13 | Page 15 |
|  | lower | Page 12 | Page 14 |
| WL2 | upper | Page 9 | Page 11 |
|  | lower | Page 8 | Page 10 |
| WL1 | upper | Page 5 | Page 7 |
|  | lower | Page 4 | Page 6 |
| WL0 | upper | Page 1 | Page 3 |
|  | lower | Page 0 | Page 2 |

Fig. 11E

| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |

Fig. 11F

| Wordline | Upper/ Lower Page | Even Bit Lines | Odd Bit Lines |
|---|---|---|---|
| WL3 | upper | Page 14 | Page 15 |
|  | lower | Page 10 | Page 11 |
| WL2 | upper | Page 12 | Page 13 |
|  | lower | Page 6 | Page 7 |
| WL1 | upper | Page 8 | Page 9 |
|  | lower | Page 2 | Page 3 |
| WL0 | upper | Page 4 | Page 5 |
|  | lower | Page 0 | Page 1 |

Fig. 11G

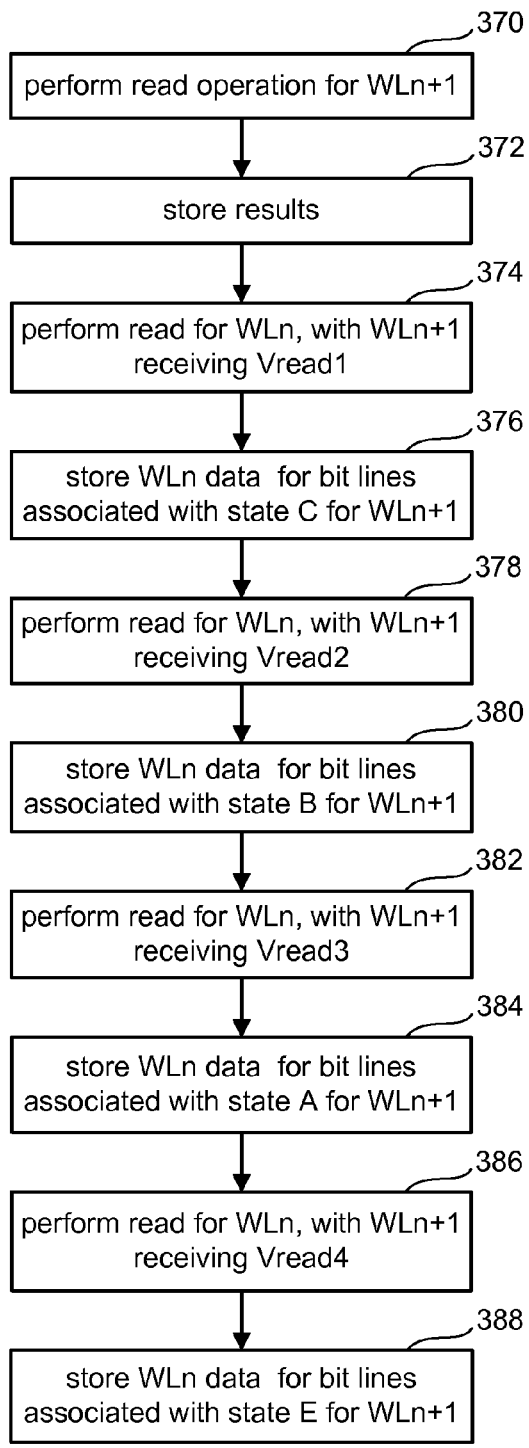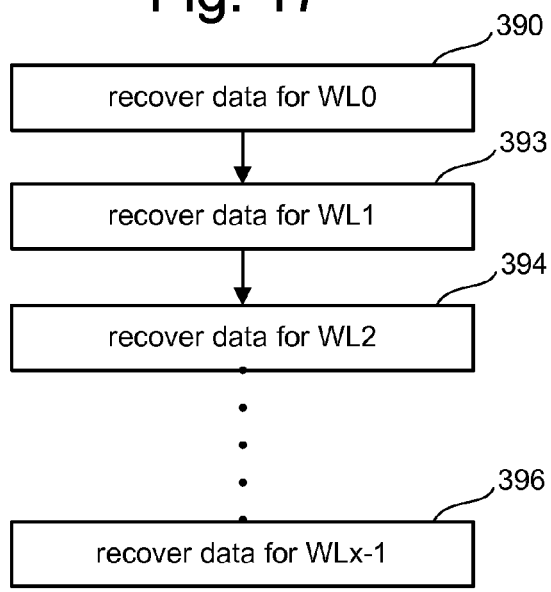

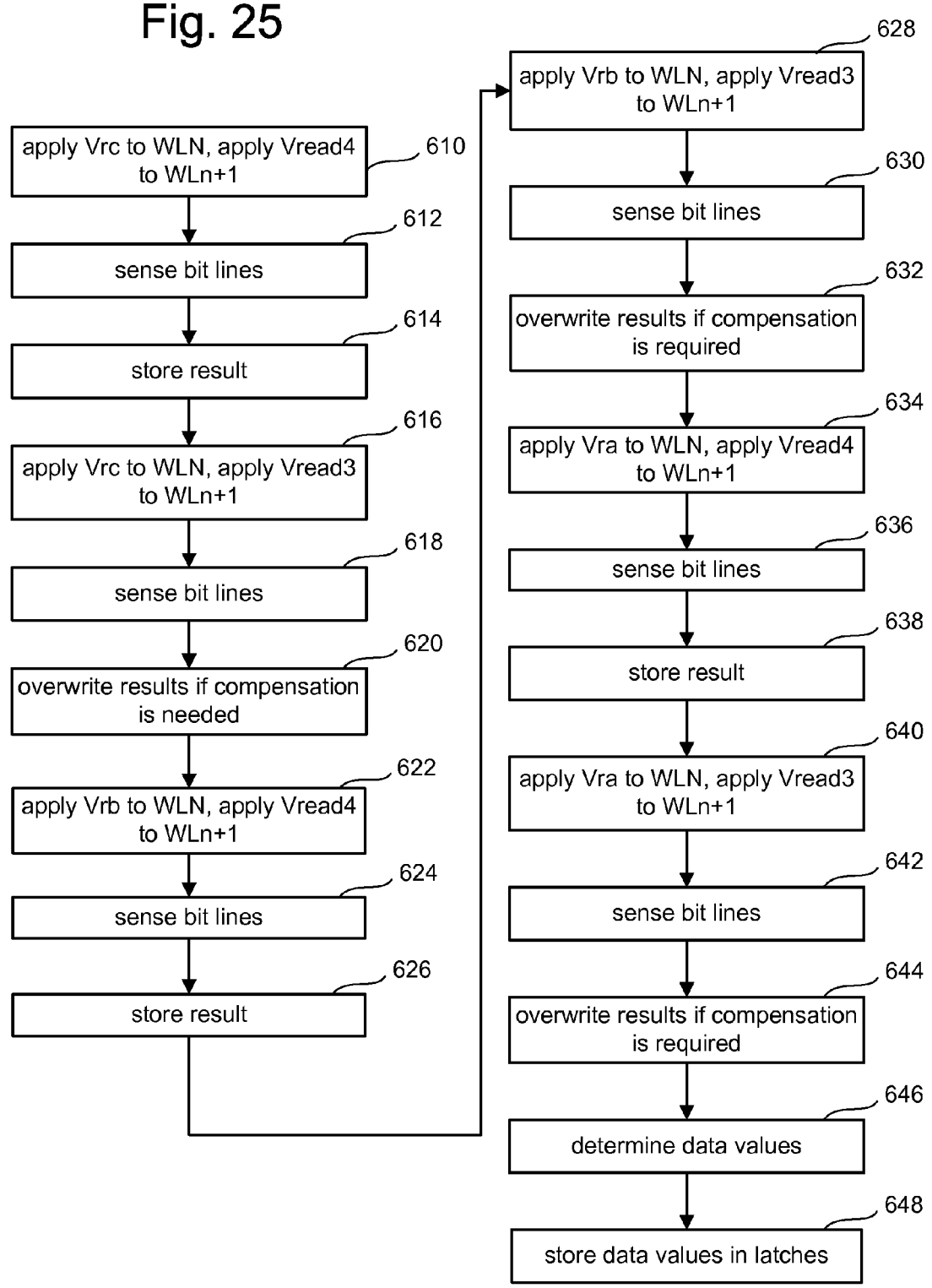

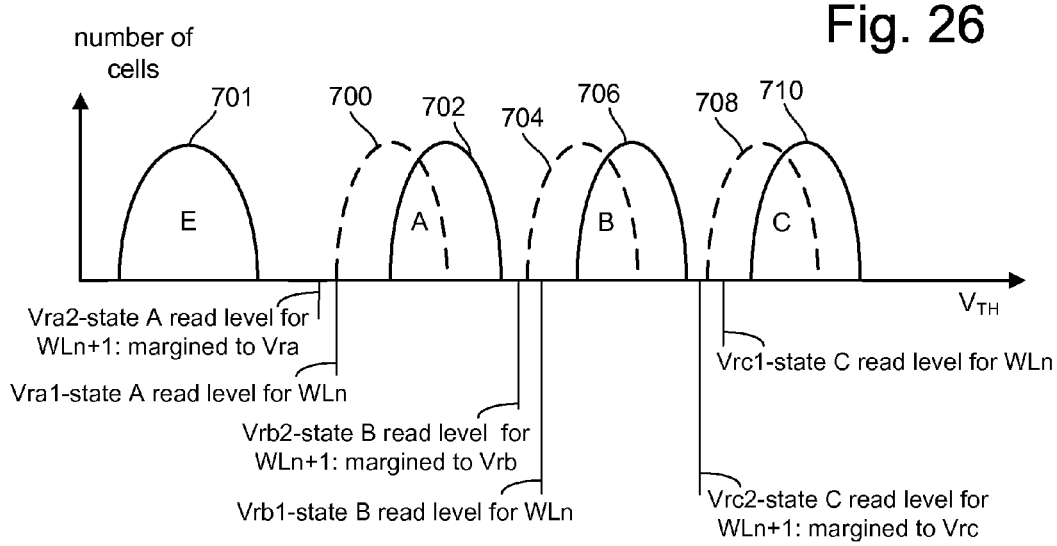
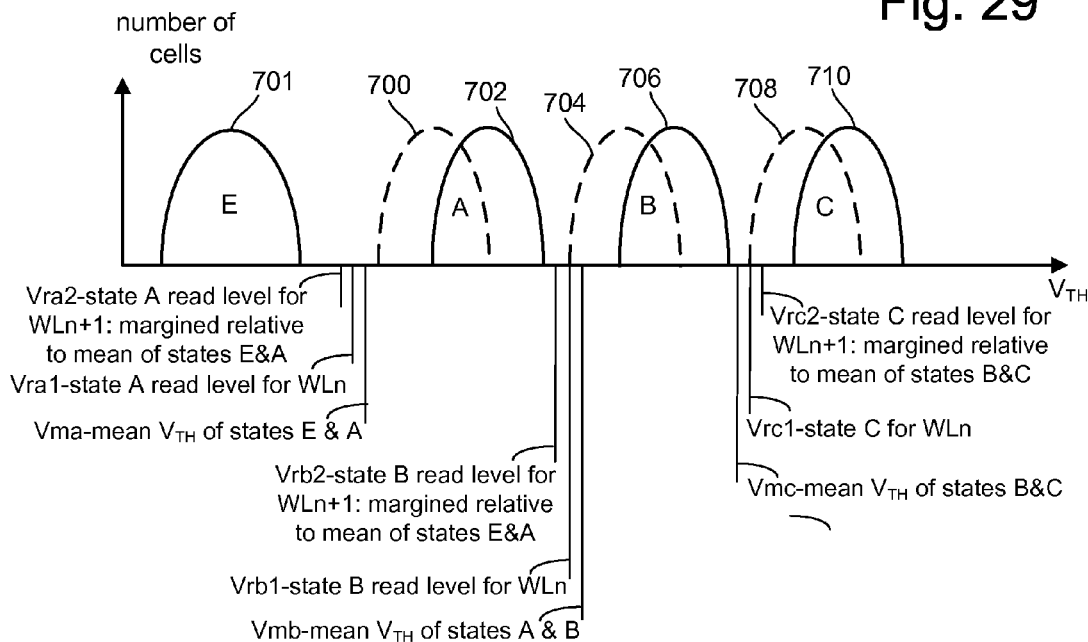

SYSTEMS FOR MARGINED NEIGHBOR READING FOR NON-VOLATILE MEMORY READ OPERATIONS INCLUDING COUPLING COMPENSATION

CROSS-REFERENCE TO RELATED APPLICATIONS

The following application is cross-referenced and incorporated by reference herein in its entirety:

U.S. patent application Ser. No. 11/618,616, entitled "Margined Neighbor Reading for Non-Volatile Memory Read Operations Including Coupling Compensation," now U.S. Pat. No. 7,518,923, by Nima Mokhlesi, filed on even date herewith.

BACKGROUND OF THE INVENTION

1. Field of the Invention

The present invention relates to technology for non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device. A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device. More information about programming can be found in U.S. Pat. No. 6,859,397, titled "Source Side Self Boosting Technique for Non-Volatile Memory," and in U.S. Pat. No. 6,917,542, titled "Detecting Over Programmed Memory," both incorporated herein by reference in their entirety.

Shifts in the apparent charge stored on a floating gate or other charge region can occur because of the coupling of an electric field based on the charge stored in adjacent floating gates. This floating gate to floating gate coupling phenomenon is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are diagonal from the target floating gate because they are on both a neighboring bit line and neighboring word line.

Floating gate to floating gate coupling occurs most pronouncedly between sets of adjacent memory cells that have been programmed at different times. For example, a first memory cell may be programmed to add a level of charge to its floating gate that corresponds to one set of data. Subsequently, one or more adjacent memory cells are programmed to add a level of charge to their floating gates that corresponds to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than memories using only two states (binary memories). Furthermore, the reduction of the space between word lines and of the space between bit lines will also increase the coupling between adjacent floating gates.

SUMMARY OF THE INVENTION

To account for the coupling between floating gates, the read process for a particular memory cell provides compensation to an adjacent memory cell in order to reduce the coupling effect that the adjacent memory cell has on the particular memory cell. The adjacent memory cell is read to determine charge, state or other conditional information of the cell. The information from the adjacent memory cell is used to provide the appropriate compensation thereto when reading the particular memory cell during the read process. When reading the adjacent memory cell, margined reference voltages can be used to account for shifts in the apparent threshold voltage of the adjacent memory cell.

One embodiment includes reading non-volatile memory by applying a read voltage corresponding to a particular state to an unselected non-volatile storage element at a first voltage level to determine a condition of the unselected non-volatile storage element during a read process for a selected non-volatile storage element neighboring the unselected non-volatile storage element, applying the read voltage to the selected non-volatile storage element at a second voltage level during the read process, using a particular voltage for the unselected non-volatile storage element when applying the read voltage to the selected non-volatile storage element based on the condition of the unselected non-volatile storage element, and sensing a condition of the selected non-volatile storage element during the read process.

One exemplary implementation comprises a plurality of non-volatile storage elements and managing circuitry in communication with the plurality of non-volatile storage elements for performing the processes of the present disclosure. In one embodiment managing circuitry in communication with the plurality of non-volatile storage elements provides a first pass voltage to a first non-volatile storage element when verifying programming of a second non-volatile storage element, provides a second pass voltage to the first non-volatile storage element when determining a current condition of the second non-volatile storage element during a read process for a third non-volatile storage element, provides a first read voltage corresponding to a particular state to the second non-volatile storage element when determining the current condition, and provides a second read voltage corresponding to the particular state to the third non-volatile storage element to determine a condition of the third non-volatile storage element during the read process. The first read voltage is based on a difference between the first pass voltage and the second pass voltage in one embodiment.

BRIEF DESCRIPTION OF THE DRAWINGS

FIGS. 11A-11G are tables depicting the order of programming non-volatile memory in various embodiments.

FIG. 16 is a flow chart describing one embodiment of a process for recovering data.

FIG. 17 is a flow chart describing one embodiment of a process for recovering data from multiple word lines.

FIG. 24 is a table depicting a process for determining data values.

FIG. 25 is a flow chart describing one embodiment of a process for reading upper page data using a correction.

FIG. 26 depicts an exemplary set of threshold voltage distributions illustrating an apparent shift in threshold voltage and two sets of read reference voltages.

FIG. 29 depicts an exemplary set of threshold voltage distributions illustrating an apparent shift in threshold voltage and two sets of read reference voltages.

DETAILED DESCRIPTION

Figure 1:
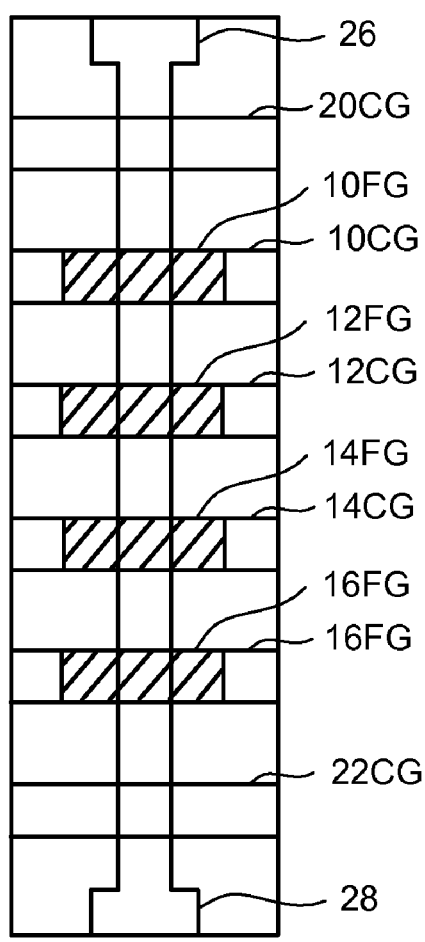
FIG. 1 is a top view of a NAND string.
Figure 2:
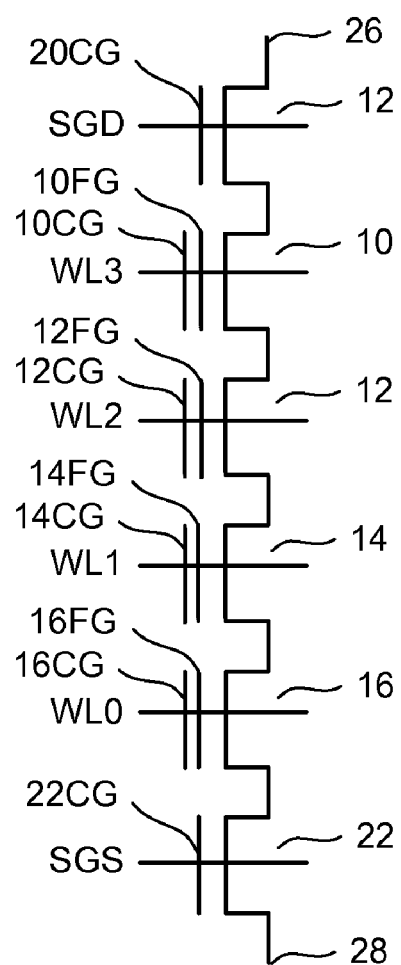
FIG. 2 is an equivalent circuit diagram of the NAND string.

One example of a flash memory system uses the NAND structure, which includes arranging multiple transistors in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Relevant examples of NAND-type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments.

Figure 3:
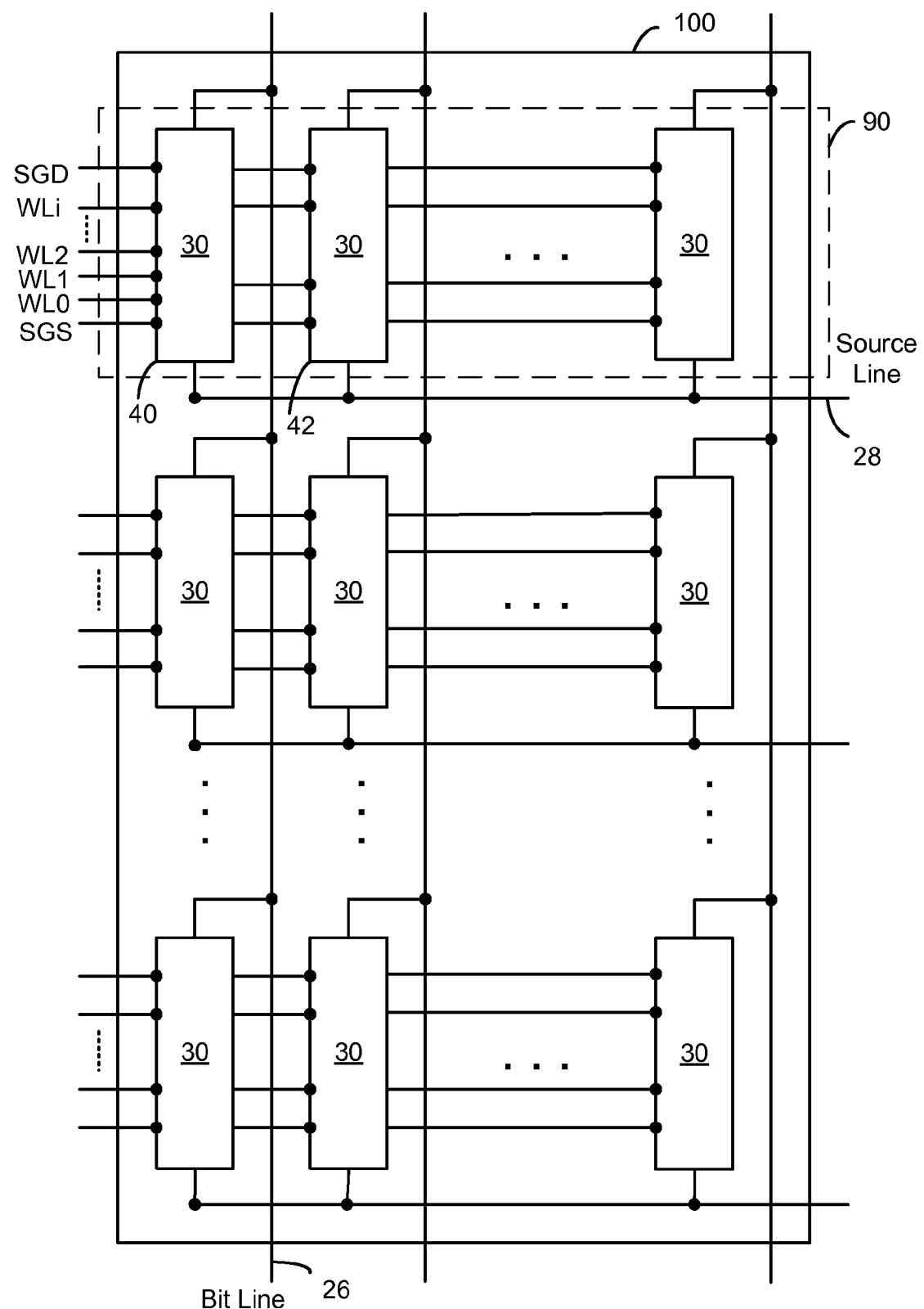
FIG. 3 is a block diagram of an array of NAND flash memory cells.

A typical architecture for a flash memory system using a NAND structure will include several NAND strings. FIG. 3 illustrates an exemplary array 100 of NAND strings, such as those shown in FIGS. 1-2. Along each column, a bit line 26 is coupled to a drain terminal of the bit line select gate for the NAND string. Along each row of NAND strings, a source line may connect all the source terminals of the source line select gates of the NAND strings.

The array 100 of memory cells is divided into a large number of blocks of memory cells. As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations. In FIG. 3, a block includes the cells connected to a common set of word lines WL0-WL3. For example, block 90 includes each NAND string 30 connected to word lines WL0-WL3.

Each block of memory cells includes a set of bit lines forming columns and a set of word lines forming rows in one embodiment. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

The bit lines are divided into even bit lines (BLe) and odd bit lines (BLo) in one embodiment. In an odd/even bit line architecture, memory cells along a common word line and connected to the odd bit lines are programmed at one time, while memory cells along a common word line and connected to even bit lines are programmed at another time. The data that is simultaneously read or programmed forms a logical page.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 4:
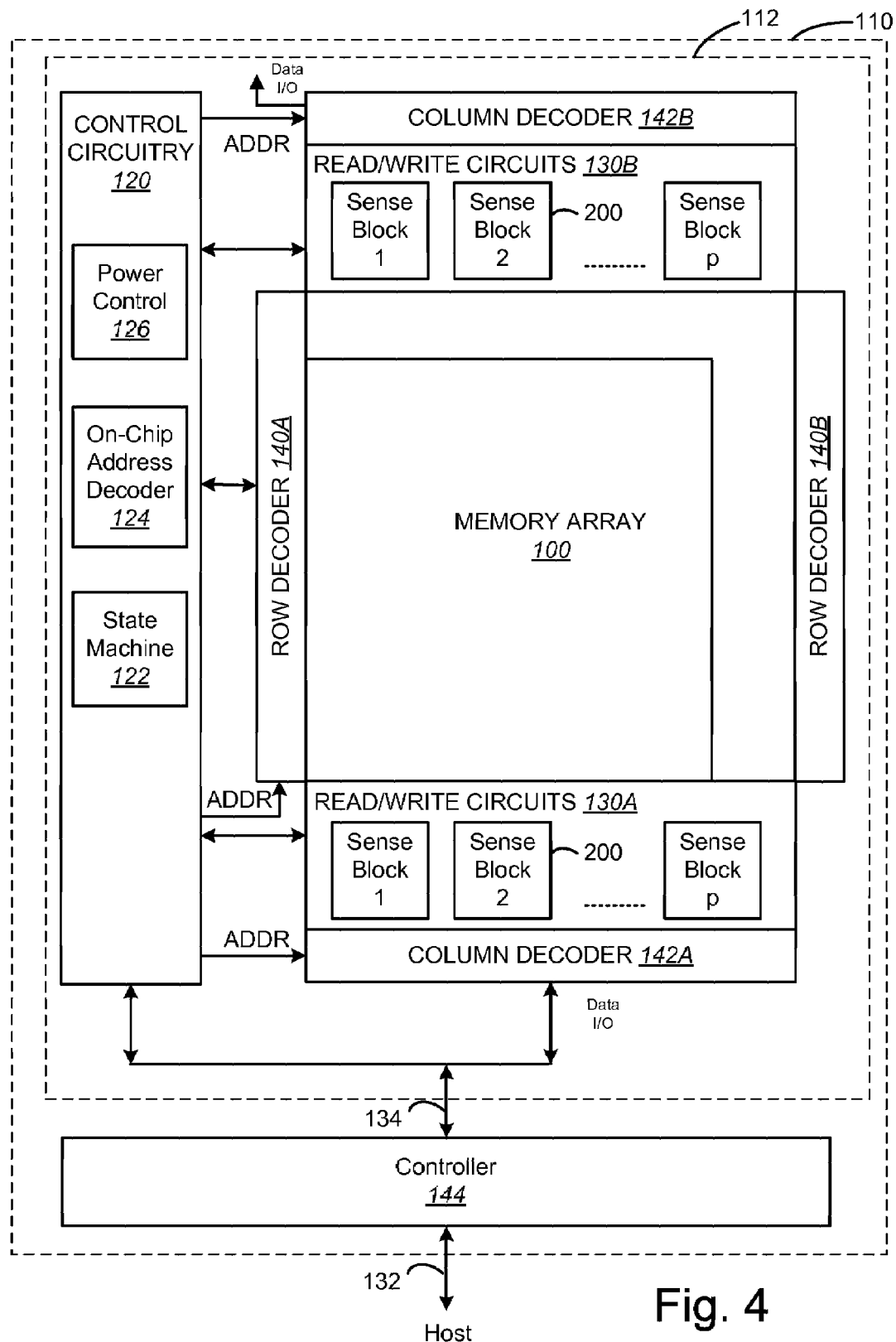
FIG. 4 is a block diagram of a non-volatile memory system.

FIG. 4 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In the embodiment of FIG. 4, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 5:
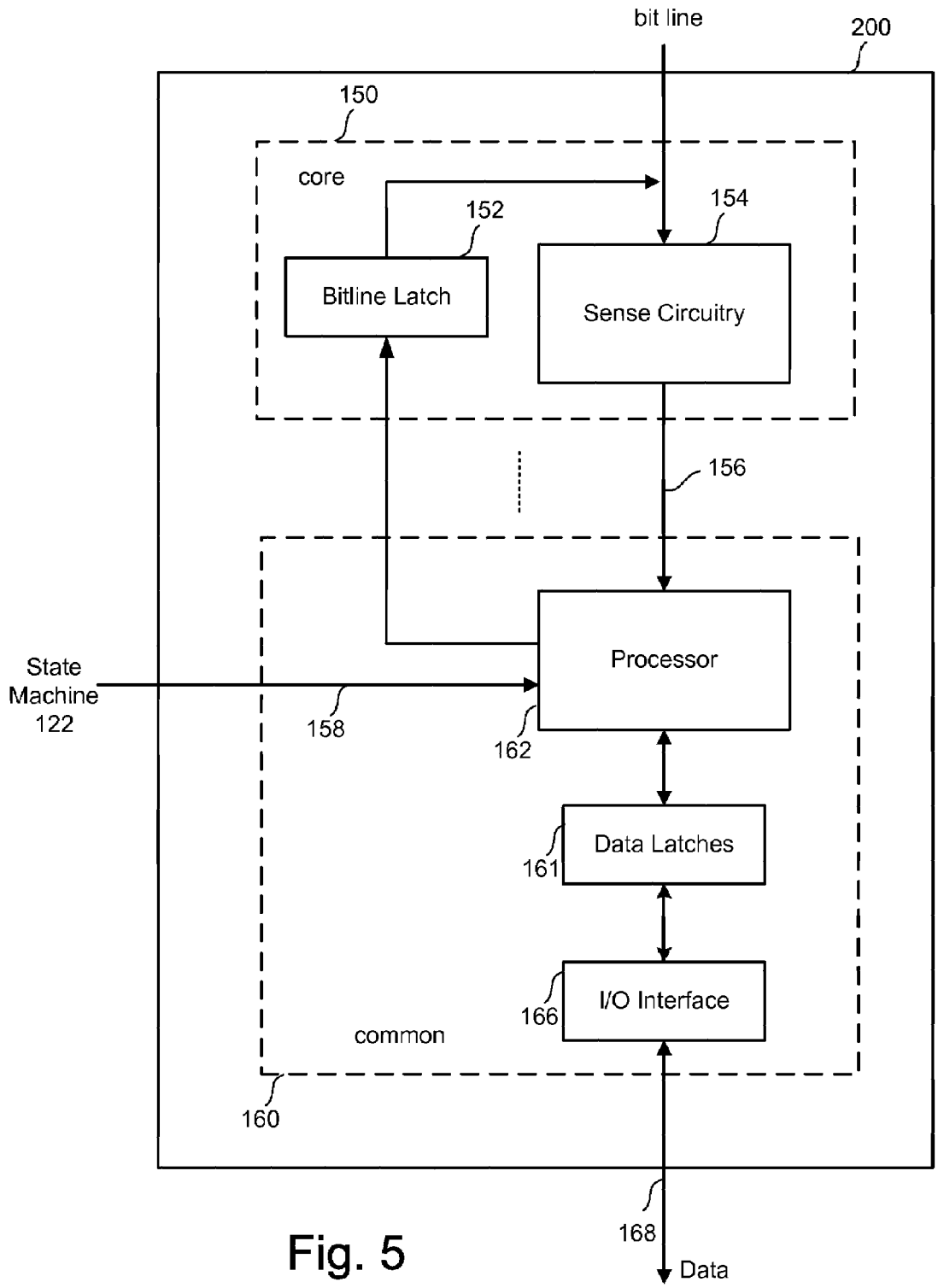
FIG. 5 is a block diagram depicting one embodiment of a sense block.

FIG. 5 is a block diagram of an individual sense block 200 partitioned into a core portion, referred to as a sense module 150, and a common portion 160. In one embodiment, there will be a separate sense module 150 for each bit line and one common portion 160 for a set of multiple sense modules 150. In one example, a sense block will include one common portion 160 and eight sense modules 150. Each of the sense modules in a group will communicate with the associated common portion via a data bus 156. For further details refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 150 comprises sense circuitry 154 that determines whether a conduction current in a connected bit line is above or below a predetermined threshold level. Sense module 150 also includes a bit line latch 152 that is used to set a voltage condition on the connected bit line. For example, a predetermined state latched in bit line latch 152 will result in the connected bit line being pulled to a state designating program inhibit (e.g., $V_{DD}$).

Common portion 160 comprises a processor 162, a set of data latches 164 and an I/O Interface 166 coupled between the set of data latches 164 and data bus 168. Processor 162 performs computations. For example, one of its functions is to determine the data stored in the sensed memory cell and store the determined data in the set of data latches. The set of data latches 164 is used to store data bits determined by processor 162 during a read operation. It is also used to store data bits imported from the data bus 168 during a program operation. The imported data bits represent write data meant to be programmed into the memory.

During read or sensing, the operation of the system is under the control of state machine 122 that controls the supply of different control gate voltages to the addressed cell. As it steps through the various predefined control gate voltages corresponding to the various memory states supported by the memory, the sense module 150 may trip at one of these voltages and an output will be provided from sense module 150 to processor 162 via bus 156. At that point, processor 162 determines the resultant memory state by consideration of the tripping event(s) of the sense module and the information about the applied control gate voltage from the state machine via input lines 158. It then computes a binary encoding for the memory state and stores the resultant data bits into data latches 164. In another embodiment of the core portion, bit line latch 152 serves double duty, both as a latch for latching the output of the sense module 150 and also as a bit line latch as described above.

It is anticipated that some implementations will include multiple processors 162. In one embodiment, each processor 162 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 162 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 164 from the data bus 168. The program operation, under the control of the state machine, comprises a series of programming voltage pulses applied to the control gates of the addressed memory cells. Each programming pulse is followed by a read back (verify) to determine if the cell has been programmed to the desired memory state. Processor 162 monitors the read back memory state relative to the desired memory state. When the two are in agreement, the processor 162 sets the bit line latch 152 so as to cause the bit line to be pulled to a state designating program inhibit. This inhibits the cell coupled to the bit line from further programming even if programming pulses appear on its control gate. In other embodiments the processor initially loads the bit line latch 152 and the sense circuitry sets it to an inhibit value during the verify process.

Data latch stack 164 contains a stack of data latches corresponding to the sense module. In one embodiment, there are three data latches per sense module 150. In some implementations (but not required), the data latches are implemented as a shift register so that the parallel data stored therein is converted to serial data for data bus 168, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

In one embodiment, data is programmed to memory cells along a common word line. Thus, prior to applying the program pulses of FIG. 9, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 2 is the selected word line, then WL1 is the source side neighboring word line and WL3 is the drain side neighboring word line.

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12V. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 1.8V-3.3V) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 6:
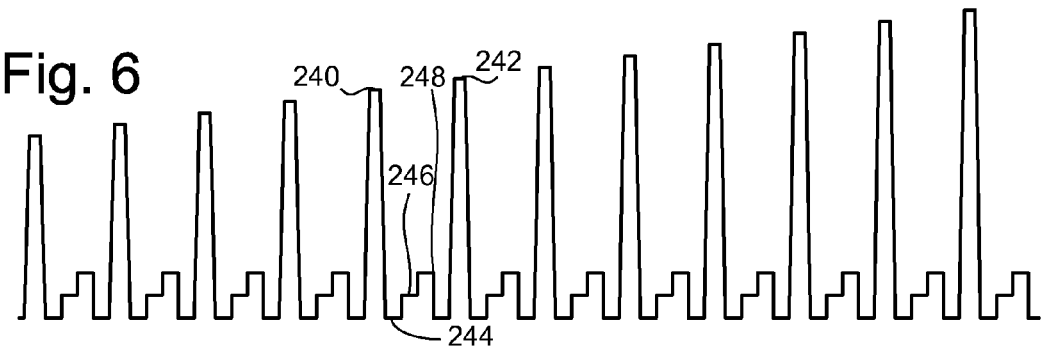
FIG. 6 is an exemplary wave form applied to the control gates of non-volatile memory cells during programming and program verification.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2V (or 0.4V). Between each of the program pulses are the verify pulses. The signal of FIG. 6 assumes a four state memory cell, therefore, it includes three verify pulses. For example, between programming pulses 240 and 242 are three sequential verify pulses. The first verify pulse 244 is depicted at a 0V verify voltage level. The second verify pulse 246 follows the first verify pulse at the second verify voltage level. The third verify pulse 248 follows the second verify pulse at the third verify voltage level. A multi-state memory cell capable of storing data in eight states, for example, may need to perform verify operations at seven compare points. Thus, seven verify pulses would applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Apparatus for Programming of Multi-State Non-Volatile Memory Using Smart Verify," filed Oct. 27, 2005; and U.S. patent application Ser. No. 11/260,658, entitled "Method for Programming of Multi-State Non-Volatile Memory Using Smart Verify," filed Oct. 27, 2005, all of which are incorporated herein by reference in their entirety.

Figure 7:
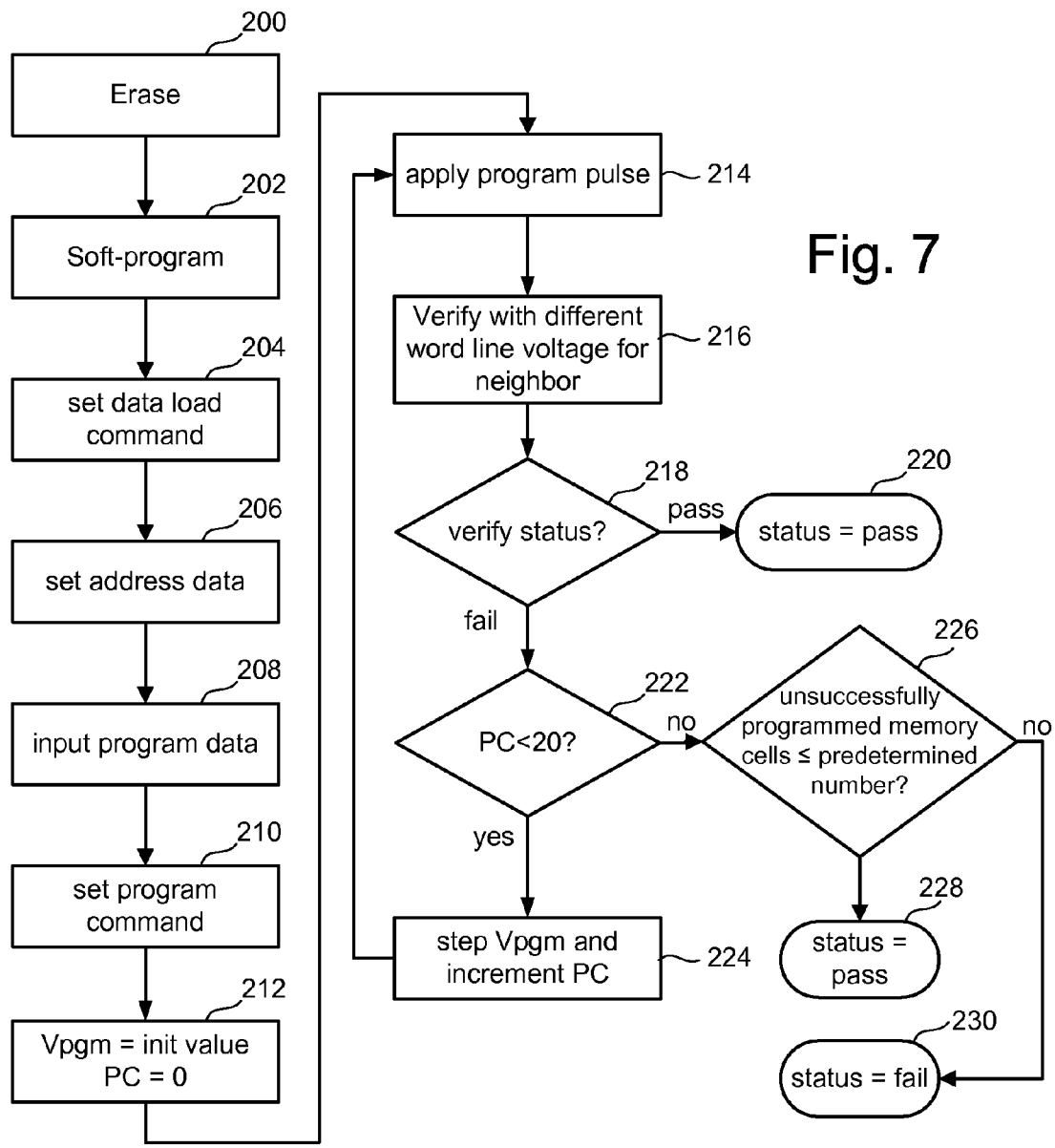
FIG. 7 is a flow chart describing one embodiment of a process for programming non-volatile memory.

FIG. 7 is a flow chart describing one embodiment of a method for programming non-volatile memory. The memory cells to be programmed are erased at step 200. Step 200 can include erasing more memory cells than those to be programmed (e.g., in blocks or other units). At step 202, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 204, a "data load" command is issued by controller 144 and input to control circuitry 120, allowing data to be input to a data input/output buffer. The input data is recognized as a command and latched by state machine 122 via a command latch signal, not illustrated, input to control circuitry 120. At step 206, address data designating the page address is input to row controllers or decoders 140A and 140B from the controller or host. The input data is recognized as the page address and latched via state machine 122, affected by the address latch signal input to the control circuitry. At step 208, a page of program data for the addressed page is input to a data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 210, a "program" command is issued by the controller and input to the data input/output buffer. The command is latched by state machine 122 via the command latch signal input to the control circuitry.

Triggered by the "program" command, the data latched in step 208 will be programmed into the selected memory cells controlled by state machine 122 using the stepped pulses of FIG. 6 applied to the appropriate word line. At step 212, $V_{PGM}$, the programming pulse voltage level applied to the selected word line, is initialized to the starting pulse (e.g., 12V) and a program counter PC maintained by state machine 122 is initialized at 0. At step 214, the first $V_{PGM}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 216, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 218, it is checked whether all of the data latches are storing logic "1." If so, the programming process is complete and successful because all selected memory cells were programmed and verified to their target states. A status of "PASS" is reported at step 220.

If, at step 218, it is determined that not all of the data latches are storing logic "1," then the programming process continues. At step 222, the program counter PC is checked against a program limit value. One example of a program limit value is 20, however, other values can be used. If the program counter PC is not less than 20, then it is determined at step 226 whether the number of cells that have not been successfully programmed is equal to or less than a predetermined number. If the number of unsuccessfully programmed bits is equal to or less than the predetermined number, then the programming process is flagged as passed and a status of pass is reported at step 228. The bits that are not successfully programmed can be corrected using error correction during the read process. If however, the number of unsuccessfully programmed bits is greater than the predetermined number, the program process is flagged as failed and a status of fail is reported at step 230. If the program counter PC is less than 20, then the $V_{PGM}$ level is increased by the step size and the program counter PC is incremented at step 224. After step 224, the process loops back to step 214 to apply the next $V_{PGM}$ pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 212-230 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

At the end of a successful program process, the threshold voltages of the memory cells should be within one or more distributions of threshold voltages for programmed memory cells or within a distribution of threshold voltages for erased memory cells. The range of possible threshold voltages of a memory cell can be divided into ranges which represent distinct memory states. For example, two ranges of threshold voltages can be used to establish two memory states that are assigned logical data "1" and "0." A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which can be assigned the data values 11, 10, 01, and 00. The specific relationship between the data programmed into the memory cell and the threshold voltage ranges of the cell depends upon the data encoding scheme adopted for the memory cells. U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Figure 8:
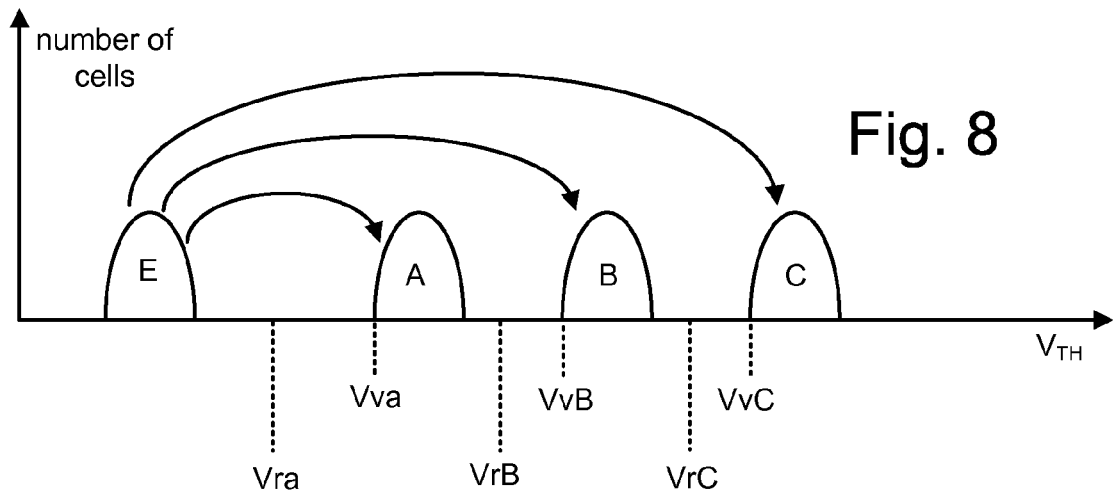
FIG. 8 depicts an exemplary set of threshold voltage distributions.

FIG. 8 illustrates threshold voltage distributions for a group of memory cells when each memory cell stores two bits of data. FIG. 8 shows a first threshold voltage distribution E for erased memory cells and three threshold voltage distributions, A, B and C for programmed memory cells. In one embodiment, the threshold voltages in the E distribution are negative and the threshold voltages in the A, B and C distributions are positive. Each distinct threshold voltage range of FIG. 8 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 8 shows four states, embodiments in accordance with the present disclosure can also be used with other binary or multi-state structures including those that include more or less than four states.

FIG. 8 also depicts a full sequence programming technique. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 9:
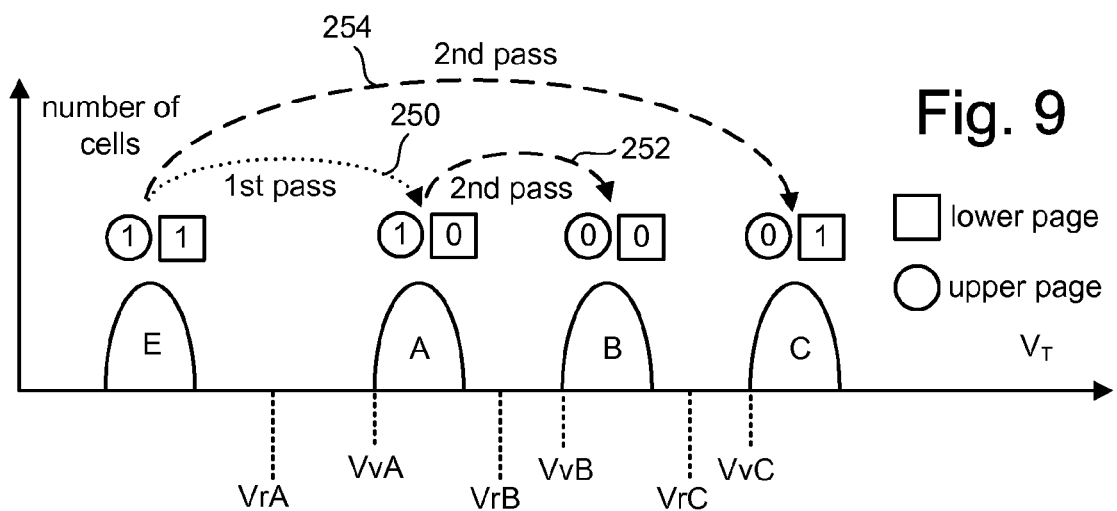
FIG. 9 depicts an exemplary set of threshold voltage distributions.

FIG. 9 illustrates an example of a two-pass technique of programming multi-state memory cells that store data for two different pages: a lower page and an upper page. Four states are depicted. For state E, both pages store a "1." For state A, the lower page stores a "0" and the upper page stores a "1". For state B, both pages store "0". For state C, the lower page stores 1 and the upper page stores "0". Although specific bit patterns have been assigned to each of the states, different bit patterns may be assigned.

In a first programming pass, the cell's threshold voltage level is set according to the bit to be programmed into the lower logical page. If that bit is a logic "1", the threshold voltage is not changed since it is in the appropriate state as a result of having been earlier erased. However, if the bit to be programmed is a logic "0", the threshold level of the cell is increased to be state A, as shown by arrow 250. That concludes the first programming pass.

In a second programming pass, the cell's threshold voltage level is set according to the bit being programmed into the upper logical page. If the upper logical page bit is to store a logic 1, then no programming occurs since the cell is in one of the states E or A, depending upon the programming of the lower page bit, both of which carry an upper page bit of 1. If the upper page bit is to be a logic 0, then the threshold voltage is shifted. If the first pass resulted in the cell remaining in the erased state E, then in the second pass the cell is programmed so that the threshold voltage is increased to be within state C, as depicted by arrow 254. If the cell had been programmed into state A as a result of the first programming pass, then the memory cell is further programmed in the second pass so that the threshold voltage is increased to be within state B, as depicted by arrow 252. The result of the second pass is to program the cell into the state designated to store a logic "0" for the upper page without changing the data for the lower page.

Figure 10A:
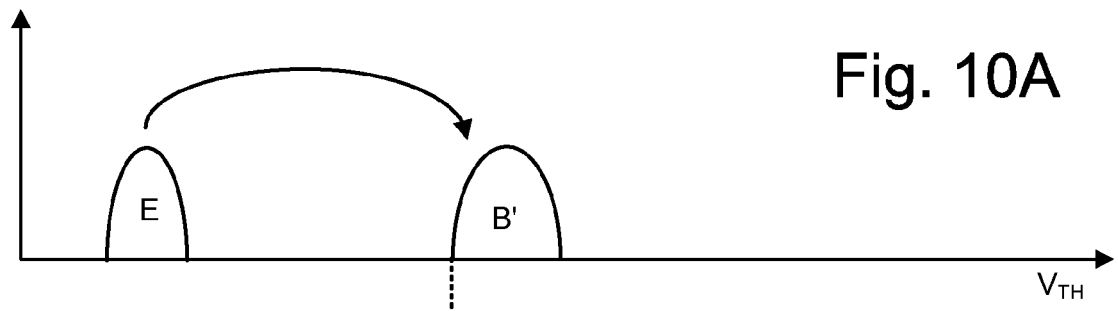
FIGS. 10A-10C show various threshold voltage distributions and describe a process for programming non-volatile memory.
Figure 10B:
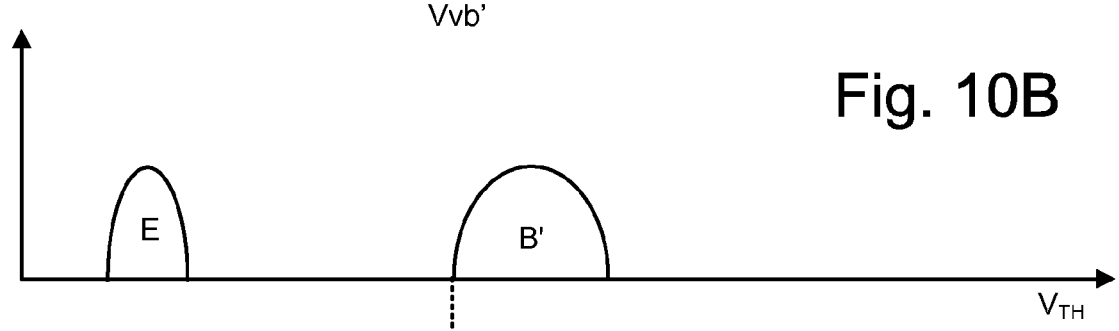
Figure 10C:
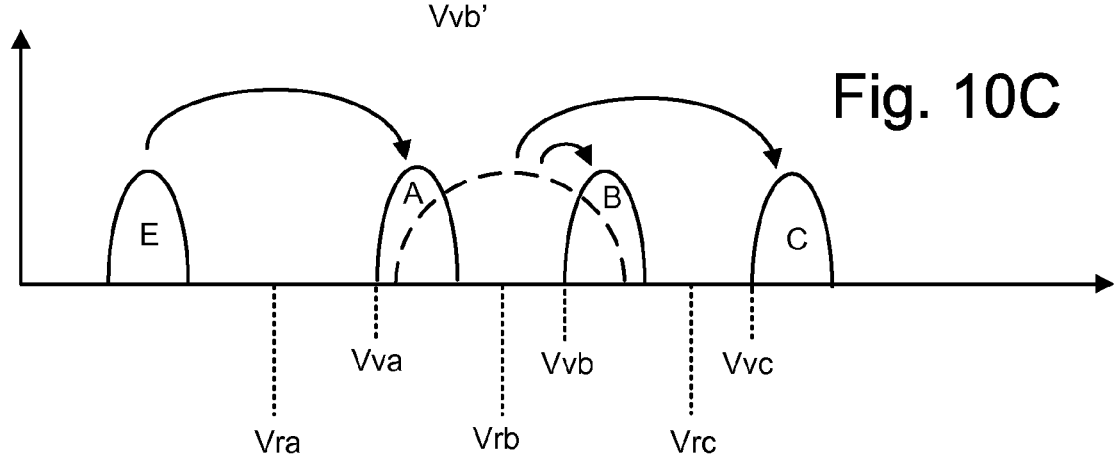

FIGS. 10A-10C disclose a process for programming non-volatile memory that reduces floating gate to floating gate coupling by, for any particular memory cell, writing to that particular memory cell with respect to a particular page subsequent to writing to adjacent memory cells for previous pages. This technique may be referred to herein as the last first mode (LM) of programming. In the example of FIGS. 10A-10C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for the lower page, state B is encoded to store bit 1 for the upper page and bit 0 for the lower page, and state C is encoded to store bit 0 for both pages. The lower page data for memory cells at a word line WLn are programmed in a first step depicted in FIG. 10A and upper page data for the cells is programmed in a second step depicted in FIG. 10C. If the lower page data is to remain data 1 for a cell, then the cell's threshold voltage remains at state E during the first step. If the lower page data is to be programmed to 0, then the threshold voltage of the memory cell is raised to state B'. State B' is an interim state B having a verify level Vvb', which is lower than Vvb.

In one embodiment, after the lower page data for the memory cell is programmed, the neighboring memory cells at adjacent word line WLn+1 will be programmed with respect to their lower page. For example, the lower page for memory cells at WL2 in FIGS. 1-3 may be programmed after the lower page for memory cells at WL1. Floating gate coupling may raise the apparent threshold voltage of memory cell 12 if the threshold voltage of memory cell 10 is raised from state E to state B' after programming memory cell 12. The cumulative coupling effect on the memory cells at WLn will widen the apparent threshold voltage distribution of threshold voltages for the cells, as depicted as in FIG. 10B. The apparent widening of the threshold voltage distribution can be remedied when programming the upper page for the word line of interest, as shown in FIG. 10C.

FIG. 10C depicts the process of programming the upper page for the cell at WLn. If a memory cell is in erased state E and its upper page bit is to remain at 1, the memory cell remains in state E. If the memory cell is in state E and its upper page data bit is to be programmed to 0, the threshold voltage of the memory cell is raised to be within the range for state A. If the memory cell was in intermediate threshold voltage distribution B' and its upper page data is to remain 1, the memory cell is programmed to final state B. If the memory cell is in intermediate threshold voltage distribution B' and its upper page data is to become data 0, the threshold voltage of the memory cell is raised to be within the range for state C. The process depicted by FIGS. 10A-10C reduces the effect of floating gate coupling because only the upper page programming of neighbor memory cells will effect the apparent threshold voltage of a given memory cell. An example of an alternate state coding for this technique is to move from intermediate state B' to state C when the upper page data is a 1, and to move to state B when the upper page data is 0. Although FIGS. 10A-10C provide an example with respect to four data states and two pages of data, the concepts can be applied to other implementations with more or less than four states and different numbers of pages.

FIGS. 11A-11F depict various tables that describe the order of programming according to various embodiments of the methods described in FIGS. 8, 9 and 10A-10C.

FIG. 11A is a table which describes the order for programming memory cells along a bit line for all bit line programming. In this embodiment, the block with four word lines includes four pages (page 0-3). Page 0 is written first, followed by page 1, followed by page 2 and then followed by page 3. The data in page 0 includes the data stored by all the memory cells connected to word line WL0. The data in page 1 includes the data stored by the memory cells connected to word line WL1. The data in page 2 includes the data stored by memory cells connected to WL2. The data in page 3 includes the data stored by memory cells connected to word line WL3. The embodiment of FIG. 11A assumes full sequence programming, as described above with respect to FIG. 8.

FIG. 11B depicts the order of programming during odd/even programming when using the full sequence programming method described above with respect to FIG. 8. In this embodiment, a block with four word lines includes eight pages of data. The memory cells on even bit lines connected to word line WL0 store data for page 0. Memory cells on odd bit lines connected to word line WL0 store data for page 1. Memory cells on even bit lines connected to word line WL1 store data for page 2. Memory cells on odd bit lines connected to word line WL1 store data for page 3. Memory cells on even bit lines connected to word line WL2 store data for page 4. Memory cells on odd bit lines connected to word line WL2 store data for page 5. Memory cells on even bit lines connected to word line WL3 store data for page 6. Memory cells on odd bit lines connected to word line WL3 store data for page 7. Data is programmed in numerical order according to page number, from page 0 to page 7.

The table of FIG. 11C describes the order for programming according to the two phase programming process of FIG. 9 for a memory array that performs all bit line programming. A block with four word lines is depicted to include eight pages. For memory cells connected to word line WL0, the lower page of data forms page 0 and the upper page data forms page 1. For memory cells connected to word line WL1, the lower page of data forms page 2 and the upper page data forms page 3. For memory cells connected to word line WL2, the lower page of data forms page 4 and the upper page data forms page 5. For memory cells connected to word line WL3, the lower page of data forms page 6 and the upper page data forms page 7. Data is programmed in numerical order according to page number, from page 0 to page 7.

FIG. 11D provides a table describing the order of programming the two-phase programming process of FIG. 9 for a memory architecture that performs odd/even programming. A block with four word lines includes 16 pages, where the pages are programmed in numerical order according to page number, from page 0 to page 15. For memory cells on even bit lines connected to word line WL0, the lower page of data forms page 0 and the upper page data forms page 2. For memory cells on odd bit lines connected to word line WL0, the lower page of data forms page 1 and the upper page of data forms page 3. For memory cells on even bit lines connected to word line WL1, the lower page forms page 4 and the upper page forms page 6. For memory cells on odd bit lines connected to word line WL1, the lower page forms page 5 and the upper page forms page 7. For memory cells on even bit lines connected to word line WL2, the lower page forms page 8 and the upper page forms page 10. For memory cells on odd bit lines connected to word line WL2, the lower page forms page 9 and the upper page forms page 11. For memory cells on even bit lines connected to word line WL3, the lower page forms page 12 and the upper page forms page 14. For memory cells on odd bit lines connected to word line WL3, the lower page forms page 13 and the upper page forms page 15. Alternately, as in FIG. 14E, both lower and upper pages under each word line of the even bit lines are programmed before programming both pages of the odd bit lines for this same word line.

FIGS. 11F and 11G describe the order for programming memory cells utilizing the programming method of FIGS. 10A-10C. FIG. 11F pertains to the architecture that performs all bit line programming. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7.

The table of FIG. 11G pertains to the architecture that performs odd/even programming. For memory cells on even bit lines connected to word line WL0, the lower page forms page 0 and the upper page forms page 4. For memory cells on odd bit lines connected to word line WL0, the lower page forms page 1 and the upper page forms page 5. For memory cells on even bit lines connected to word line WL1, the lower page forms page 2 and the upper page forms page 8. For the memory cells on odd bit lines connected to word line WL1, the lower page forms page 3 and the upper page forms page 9. For the memory cells on even bit lines connected to word line WL2, the lower page forms page 6 and the upper page forms page 12. For the memory cells on odd bit lines connected to word line WL2, the lower page forms page 7 and the upper page forms page 13. For the memory cells on even bit lines connected to word line WL3, the lower page forms page 10 and the upper page forms page 14. For the memory cells on odd bit lines connected to word line WL3, the lower page forms page 11 and the upper page forms page 15. Memory cells are programmed in numerical order according to page number, from page 0 to page 15. Finally, each of the architectures having both even and odd bit lines can be implemented with all the even bit lines located physically together in, for example, the left side of the chip, and all of the odd bit lines located together in, for example, the right side of the chip.

Note that in the embodiments of FIGS. 11A-11G, memory cells are programmed along a NAND string from source side to the drain side. Also, the tables depict only an embodiment with four word lines. The various methods depicted within the tables can be applied to systems with more or less than four word lines and that program in different directions (e.g., drain to source) by appropriately modifying the order. Examples of an architecture using odd/even programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; U.S. Pat. Nos. 6,771,536; 6,781,877.

Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Those cells whose erase is to be inhibited have their word lines set to a floating condition. Due to capacitive coupling, the unselected word lines, bit lines, select lines, and common source lines are also raised to a significant fraction of the erase voltage, thus inhibiting erasing of the unselected cells. Erasing can be performed on the entire memory array, separate blocks, or another unit of cells.

For reading non-volatile memory, at least one reference threshold voltage level is generally established between each state so as to partition the threshold voltage memory window of the memory cell into the number of ranges used. When the cell is read by applying predetermined, fixed voltages (e.g., read reference voltages) to its gate that correspond to the reference threshold voltage level, its source/drain conduction state is established by comparing the conduction with a breakpoint level or reference current. Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming. The technology described herein for reading data can also be used for any of the programming schemes of FIGS. 8-9 and 10A-10C, as well as other programming schemes.

FIG. 8 shows three read reference voltages, VrA, VrB and VrC, for reading data from the memory cells. By testing whether the threshold voltage of a given memory cell is above or below VrA, VrB and VrC, the system can determine what state the memory cell is in. If a memory cell conducts with VrA applied to its control gate, then the memory cell is in state E. If a memory cell conducts at VrB and VrC but not at VrA, then the memory cell is in state A. If the memory cell conducts at VrC but not at VrA and VrB, then the memory cell is in state B. If the memory cell does not conduct at VrA, VrB or VrC, then the memory cell is in state C. FIG. 8 also shows three verify reference voltages, VvA, VvB and VvC. When programming memory cells to state A, the system tests whether those memory cells have a threshold voltage greater than or equal to VvA. When programming memory cells to state B, the system will test whether the memory cells have threshold voltages greater than or equal to VvB. When programming memory cells to state C, the system will determine whether memory cells have their threshold voltage greater than or equal to VvC.

Figure 12:
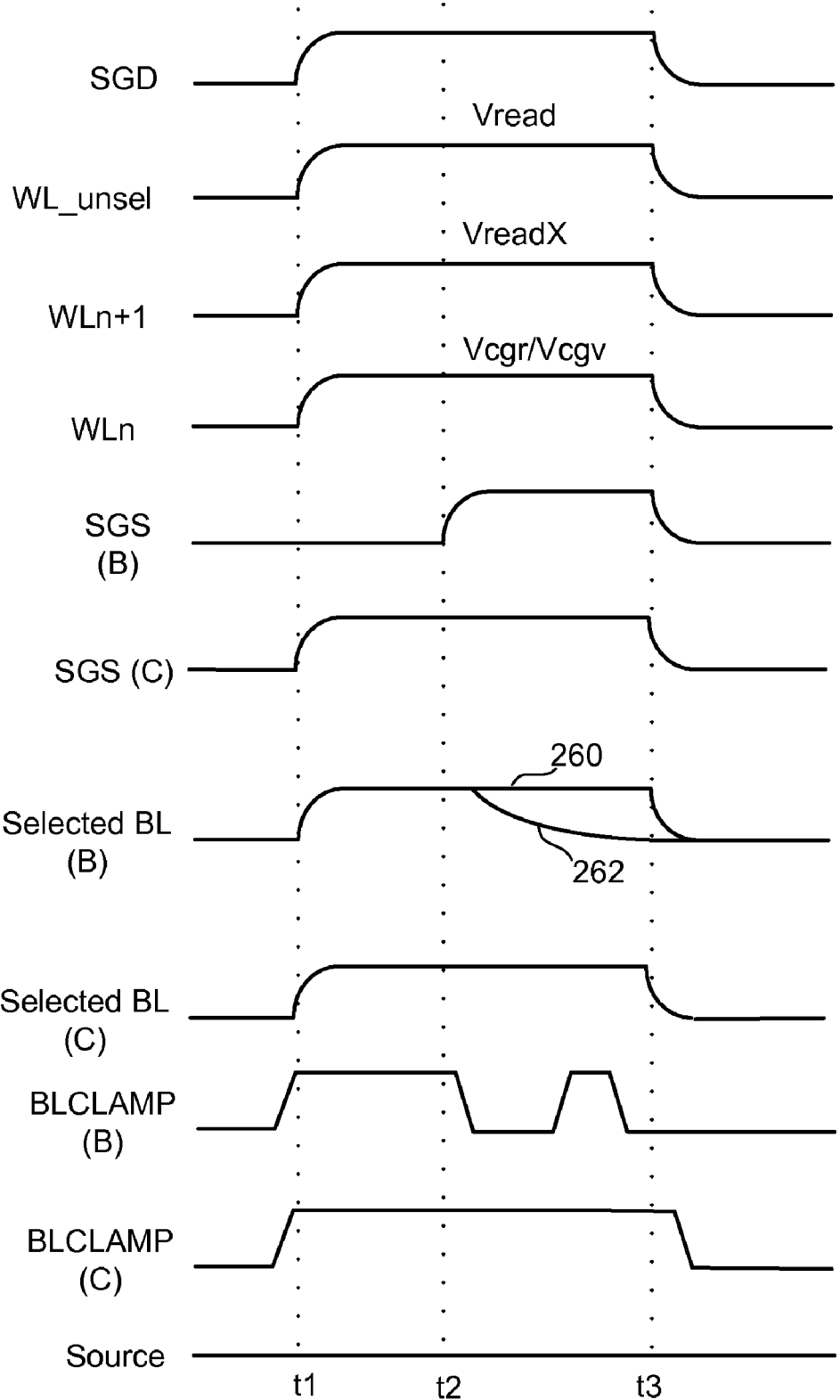
FIG. 12 is a timing diagram that explains the behavior of certain signals during read/verify operations.

FIG. 12 is a timing diagram depicting the behavior of various signals during one iteration of a read or verify process. Each iteration of the process of FIG. 12 represents a single sense operation for each cell memory. If the memory cells are binary memory cells, the process of FIG. 12 may be performed once. If the memory cells are multi-state memory cells with four states (e.g., E, A, B, and C), the process of FIG. 12 may be performed three times (three sense operations) for each memory cell.

In general, during read and verify operations the selected word line (e.g., WL2 of FIG. 3) is connected to a read reference voltage Vcgr, a level of which is specified for each read and verify operation in order to determine whether a threshold voltage of the concerned memory cell has reached such level. The select gates of a selected block are raised to one or more select voltages and the unselected word lines (e.g., WL0, WL1 and WL3 of FIG. 3) of the selected block are raised to a read pass voltage Vread (e.g. 4.5 volts) to make the transistors operate as pass gates. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line.

The charge on the bit line is measured after a period of time to see whether it has been discharged or not.

FIG. 12 shows signals SGD, WL_unsel. WLn+1, WLn, SGS, Selected BL, BLCLAMP, and Source starting at Vss (approximately 0 volts). SGD is the gate selection line of the drain side select gate. SGS is the gate selection line of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells (see FIG. 3). BLCLAMP is an analog signal that sets the value of the bit line when charged from the sense amplifier. Note that there are two versions of SGS, Selected BL and BLCLAMP depicted. One set of these signals SGS (B), Selected BL (B) and BLCLAMP (B) depict a read/verify operation for an array of memory cells that measure the conduction current of a memory cell by determining whether the bit line has discharged. Another set of these signals SGS (C), Selected BL (C) and BLCLAMP (C) depict a read/verify operation for an array of memory cells that measure the conduction current of a memory cell by the rate it discharges a dedicated capacitor in the sense amplifier.

First, the behavior of the sensing circuits and the array of memory cells that are involved in measuring the conduction current of a memory cell by determining whether the bit line has discharged will be discussed with respect to SGS (B), Selected BL (B), and BLCLAMP (B). At time t1 of FIG. 12, SGD is raised to $V_{DD}$ (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIGS. 8, 9, and 10A-10C)) for a read operation or a verify level Vcgv (e.g., Vva, Vvb, or Vvc) for a verify operation, and BLCLAMP (B) is raised to a pre-charging voltage to pre-charge the selected bit line Selected BL(B) (e.g., to approximately 0.7V). The voltages Vread and VreadX act as pass voltages because they cause the unselected memory cells to turn on (regardless of physical state or threshold voltage) and act as pass gates. At time t2, BLCLAMP (B) is lowered to Vss so the NAND string can control the bit line. Also at time t2, the source side select gate is turned on by raising SGS (B) to $V_{DD}$. This provides a path to dissipate the charge on the bit line. If the threshold voltage of the memory cell selected for reading is greater than Vcgr or Vcgv applied to the selected word line WLn, then the selected memory cell will not turn on and the bit line will not discharge, as depicted by signal line 260. If the threshold voltage in the memory cell selected for reading is below Vcgr or Vcgv applied to the selected word line WLn, then the memory cell selected for reading will turn on (conduct) and the bit line voltage will dissipate, as depicted by curve 262. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it discharges a dedicated capacitor in the sense amplifier will be discussed with respect to SGS (C), Selected BL (C) and BLCLAMP (C). At time t1 of FIG. 9, SGD is raised to $V_{DD}$ (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIG. 11) for a read operation or Vcgv (e.g., Vva, Vvb, or Vvc of FIG. 11) for a verify operation, and BLCLAMP (C) is raised. In this case, the sense amplifier holds the bit line voltage constant regardless of what the NAND sting is doing, so the sense amplifier measures the current flowing with the bit line "clamped" to that voltage. Therefore, BLCLAMP (C) rises at t1 and does not change from t1 to t3. At some point after time t1 and prior to time t3 (as determined by the particular implementation), the sense amplifier will determine whether the capacitor in the sense amplifier has dissipated a sufficient amount. At time t3, the depicted signals will be lowered to Vss (or another value for standby or recovery). Note that in other embodiments, the timing of some of the signals can be changed.

Figure 13:
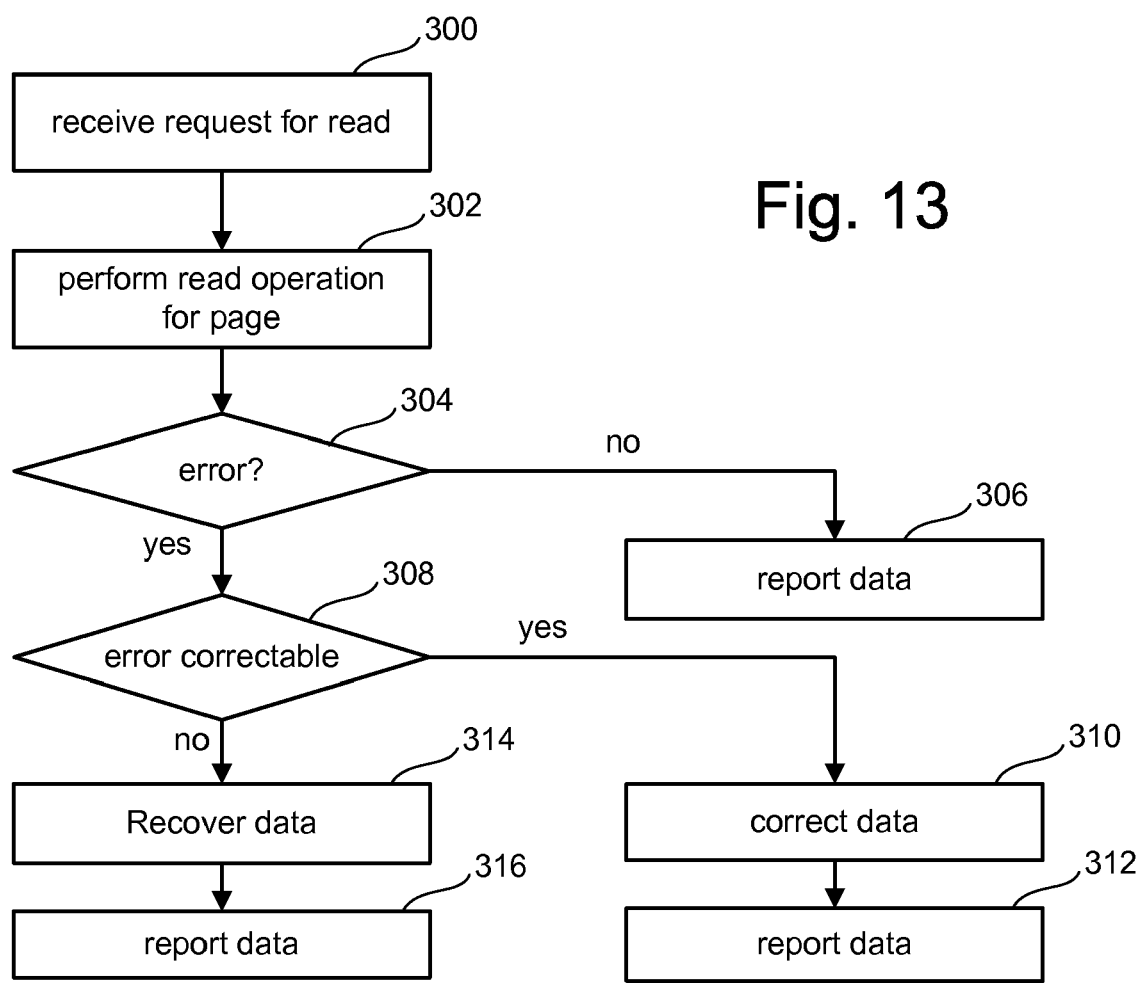
FIG. 13 is a flow chart describing one embodiment of a process for reading non-volatile memory.

FIG. 13 is a flow chart describing one embodiment for reading data from non-volatile memory cells, such as those programmed according to the techniques of FIGS. 8, 9, or 10A-10C. FIG. 13 provides the read process at the system level. At step 300, a request to read data is received. At step 302, a read operation is performed for a particular page in response to the request to read data. In one embodiment, when data for a page is programmed, the system will also create extra bits used for Error Correction Codes (ECCs) and write those ECC bits along with the page of data. ECC technologies are well known in the art. The ECC process used can include any suitable ECC process known in the art. When reading data from a page, the ECC bits will be used to determine whether there are any errors in the data at step 304. The ECC process can be performed by the controller, the state machine or elsewhere in the system. If there are no errors in the data, the data is reported to the user at step 306. If an error is found at step 304, it is determined whether the error is correctable at step 308. The error may be due to floating gate to floating gate coupling or other reasons. Various ECC methods have the ability to correct a predetermined number of errors in a set of data. If the ECC process can correct the data, then the ECC process is used to correct that data at step 310 and the data, as corrected, is reported to the user at step 312. If the data is not correctable by the ECC process, a data recovery process is performed at step 314. In some embodiments, an ECC process will be performed after step 314. More details about the data recovery process are described below. After the data is recovered, that data is reported at step 316. At step 318, the process loops back to step 302 if additional pages are to be read or ends at step 320. Note that the process of FIG. 13 can be used with data programmed using all bit line programming or odd/even bit line programming.

Figure 14:
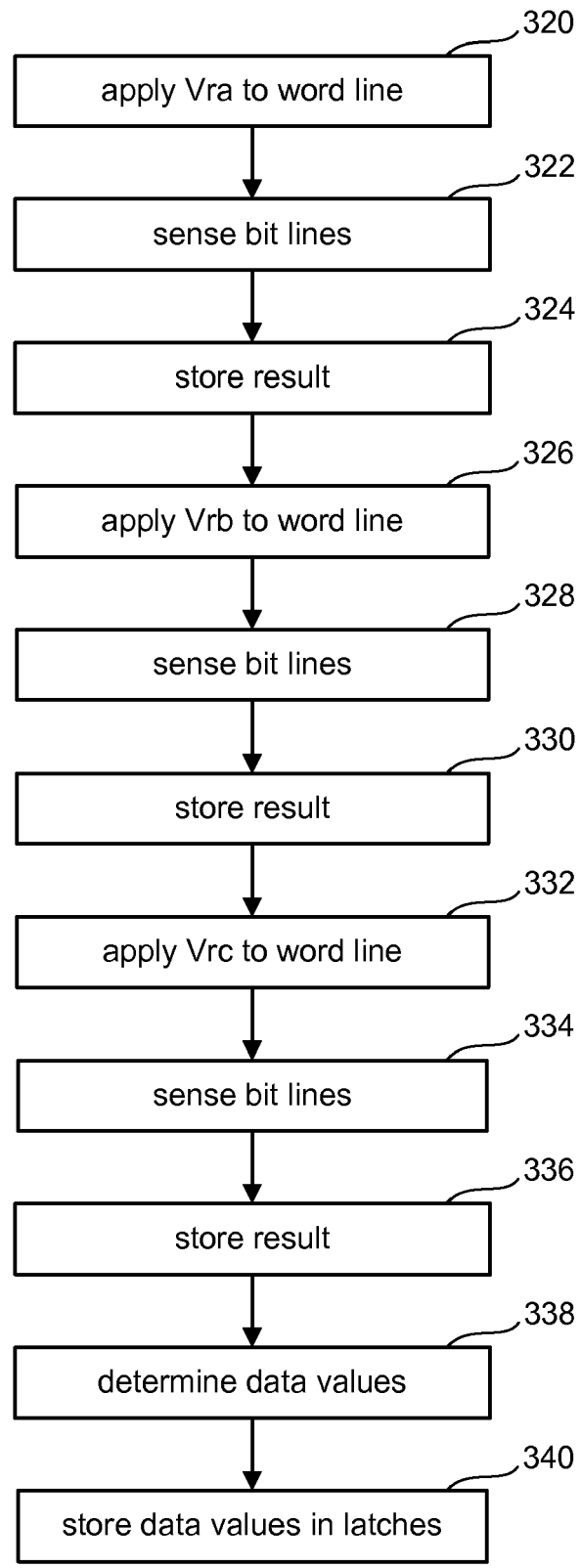
FIG. 14 is a flow chart describing one embodiment of a process for performing a read operation for non-volatile memory.

FIG. 14 is a flow chart describing one embodiment of a process for performing a read operation for a page (step 302 of FIG. 13). The process of FIG. 14 can be performed for a page that encompasses all bit lines of a block, only odd bit lines of a block, only even bit lines of a block, or other subsets of bit lines of a block. At step 320, read reference voltage Vra is applied to the appropriate word line associated with the page. At step 322, the bit lines associated with the page are sensed to determine whether the addressed memory cells turn on or do not turn on based on the application of Vra to their control gates. Bit lines that conduct indicate that the memory cells were turned on; therefore, the threshold voltages of those memory cells are below Vra (e.g., in state E). At step 324 the result of the sensing for the bit lines is stored in the appropriate latches (e.g., latches 202) for those bit lines. At step 326, read reference voltage Vrb is applied to the word lines associated with the page being read. At step 328, the bit lines are sensed as described above. At step 330, the results are stored in the appropriate latches for the bit lines. At step 332, read reference voltage Vrc is applied to the word lines associated with the page. At step 334, the bit lines are sensed to determine which memory cells turn on, as described above. At step 336, the results from the sensing step are stored in the appropriate latches for the bit lines. At step 338, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 162. At step 340, processor 162 will store the determined data values in the appropriate latches (e.g., latches 164) for each bit line. In other embodiments, sensing the various levels (Vra, Vrb, and Vrc) may occur in different orders.

Steps 320-324 can include performing the operation depicted in FIG. 12, with Vcgr=Vra and VreadX=Vread. Steps 326-330 can include performing the operation depicted in FIG. 12, with Vcgr=Vrb and VreadX=Vread. Steps 332-336 can include performing the operation depicted in FIG. 12, with Vcgr=Vrc and VreadX=Vread.

Floating gate coupling can cause errors during read operations. The charge stored on the floating gate of a memory cell can undergo an apparent shift because of electrical field coupling associated with charge stored at a neighboring memory cell's floating gate or other charge storage region (e.g., dielectric charge storage region). While in theory the electric field from a charge on the floating gate of any memory cell in a memory array can couple to the floating gate of any other memory cell in the array, the effect is most pronounced and noticeable with adjacent memory cells as previously noted. The apparent shift in charge can result in errors when reading the memory state of a memory cell.

The effects of floating gate coupling are most pronounced in situations where a memory cell adjacent a target memory cell is programmed subsequent to the target memory cell, although its effects may be seen in other situations as well. A charge placed on the floating gage of an adjacent memory cell, or a portion of the charge, will effectively be coupled to the target memory cell through electrical field coupling, resulting in an apparent shift of the threshold voltage of the target memory cell. A memory cell's apparent threshold voltage can be shifted to such a degree after being programmed that it will not turn on and off (conduct) under the applied read reference voltages as expected for a memory cell in the memory state to which it was intended to be programmed.

Typically, rows of memory cells are programmed starting with the word line (WL0) adjacent to the source side select gate line. Programming proceeds sequentially thereafter by word line (WL1, WL2, WL3, etc.) through the strings of cells such that at least one page of data is programmed in an adjacent word line (WLn+1) after completing programming (placing each cell of the word line into its final state) of the preceding word line (WLn). This pattern of programming results in an apparent shift of the threshold voltage of memory cells after being programmed due to floating gate coupling. For every word line except the last word line of a NAND string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest.

Figure 15:
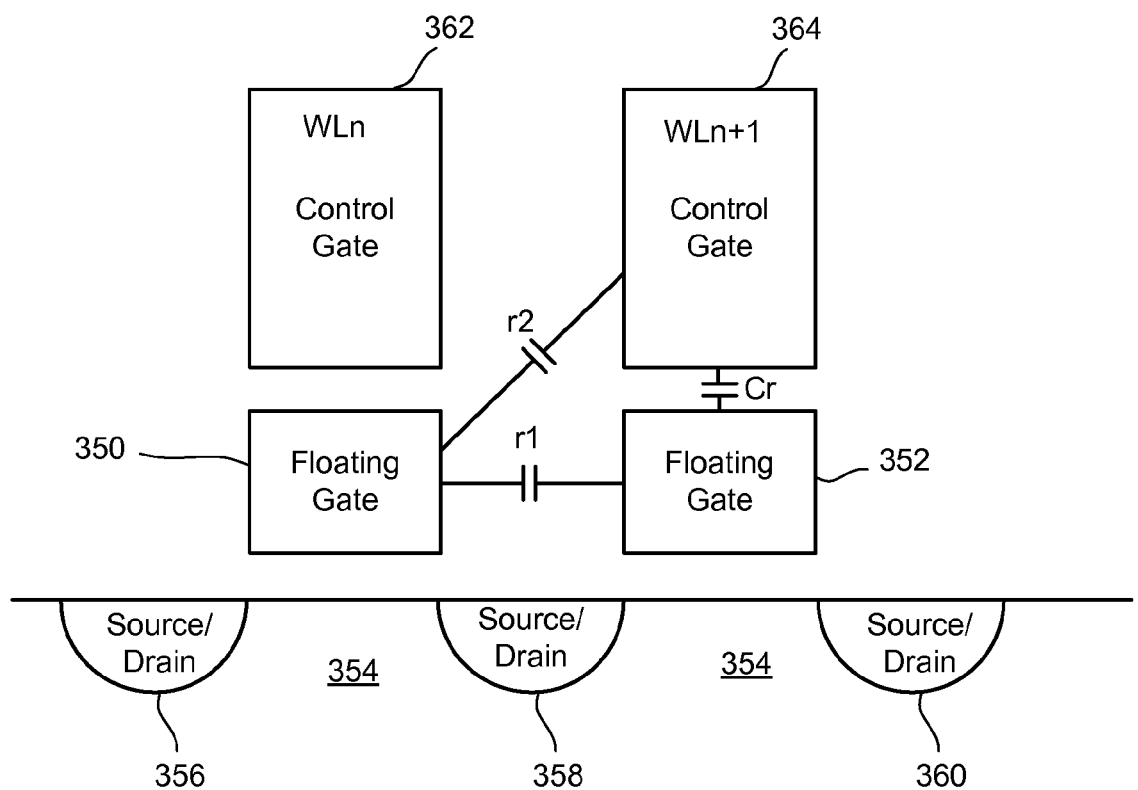
FIG. 15 is a block diagram depicting capacitive coupling between two neighboring memory cells.

FIG. 15 graphically explains the concept of floating gate to floating gate coupling. FIG. 15 depicts neighboring floating gates 350 and 352, which are on the same NAND string. Floating gates 350 and 352 are situated above NAND channel/regions 354 and the well or substrate, which has source/drain regions 356, 358 and 360. Above floating gate 350 is control gate 362 that is connected to and part of word line WLn. Above floating gate 352 is control gate 364 that is connected to and part of word line WLn+1. Although floating gate 350 will likely be subject to coupling from multiple other floating gates, for simplicity FIG. 15 only shows the effects from one neighboring memory cell. FIG. 15 shows three components of coupling provided to floating gate 350 from its neighbor: r1, r2 and Cr. The component r1 is the coupling ratio between the neighboring floating gates (350 and 352), and is calculated as the capacitance of the neighboring floating gates divided by the sum of all capacitive couplings of floating gate 350 to all the other electrodes surrounding it. The component r2 is the coupling ratio between the floating gate 350 and the drain side neighbor control gate 364, and is calculated as the capacitance of floating gate 350 and control gate 364 divided by the sum of all capacitive couplings of floating gate 350 to all the other electrodes surrounding it. The component Cr is the control gate coupling ratio and is calculated as the capacitance between floating gate 352 and its corresponding control gate 364 divided by the sum of all capacitive couplings of floating gate 352 to all the other electrodes surrounding it.

In one embodiment, an amount of required compensation, $\Delta V read$, can be calculated when reading a memory cell at selected word line WLn, as follows:

$$\Delta Vread = (\Delta VTn+1)\frac{1}{1+\frac{r2}{(r1)(Cr)}}$$

$\Delta VTn+1$ is the change in threshold voltage of the drain side neighbor memory cell between the time of program/verify of WLn and the present time. $\Delta VTn+1$ and r1 are the root causes of the word line to word line parasitic coupling effect that is mitigated by the present method. $\Delta V read$ is the compensation that is brought to bear in order to combat this effect.

Compensation for coupling described herein can be achieved by utilizing the same parasitic capacitance between neighboring floating gates as well as capacitance between the floating gate and the neighboring control gate. Since the control gate/floating gate stack is typically etched in one step, the compensation tracks the variations in spacing from memory cell to memory cell. Thus, when two neighbors are farther apart, the coupling is smaller and so will the required compensation for this effect be naturally smaller. When two neighbors are closer, the coupling is larger and so is compensation larger. This constitutes proportional compensation.

The above-described compensation also reduces the effects of variations in etch back depth. In some devices, the control gate partially wraps around the floating gate. The amount of overlap is called "etch back." Variations in etch back depth can effect the amount of coupling. With the above-described compensation scheme, the effect of the compensation will similarly vary with etch back depth.

As a result of the ability to reduce the effects of the floating gate to floating gate coupling, the margins between threshold voltage distributions can be made smaller or the memory system can program faster.

Another important advantage of the present method is that the resolution of the digital to analog converters that drive the voltages on WLn, and/or WLn+1 does not have to be as fine in comparison to some prior art which achieves the compensation through changing voltages applied to selected word line WLn. The change required for compensation when the compensation is applied to the selected word line has to be much more refined in comparison to the present invention where the change acts indirectly through parasitic couplings and therefore a much coarser resolution of Vread will translate into a much finer equivalent resolution of WLn margining voltage.

FIG. 16 includes a flow chart describing one embodiment of a process for recovering data (step 620) using a change (ΔVread) in the read pass voltage applied to a neighboring word line as compensation. Data may include an error due to the floating gate to floating gate coupling effect (or another cause). The process of FIG. 16 attempts to read the data while compensating for the floating gate to floating gate coupling effect (or another cause of error). The compensation includes looking at the neighboring word line and determining how the programming of the neighboring word line has created a floating gate to floating gate coupling effect. For example, when reading data on word line WLn (e.g., WL2 of FIG. 3), the process will also read the data of word line WLn+1 (e.g., WL3 of FIG. 3). If the data on word line WLn+1 has caused an apparent change in the data on WLn, then the read process will compensate for that unintentional change.

When reading a particular memory cell according to the read process of FIG. 16, a compensation is provided to an adjacent memory cell in order to reduce the coupling effect that the adjacent memory cell has on the particular memory cell. In such an embodiment, the pass voltage, otherwise known as Vread, applied to WLn+1 can be reduced from a typical value of, for example 6V, down to, for example 3V. Reducing Vread to 3V may be suitable for full sequence implementations as illustrated in FIG. 8 or upper/lower page implementations as shown in FIG. 9. When an implementation as shown in FIGS. 10A-10C is used, Vread may be reduced by a smaller amount to about 4.5V since the amount of floating gate coupling for which compensation is needed is less in such implementations.

The compensation includes application of a higher voltage, as compared to that voltage that was used during the verify phase of program/verify operations, to WLn+1 during the read operation performed on WLn. The compensation can consist of a change/delta: ΔVread=[[Vread(WLn+1 during read of WLn)−Vread(WLn+1 during verify of WLn)]}. The advantage of using a lower Vread during verify is that it allows the application of nominal values of Vread later during read operations, while maintaining the required ΔVread. Had it not been for the use of a smaller than normal value of Vread during verify, the necessary value of Vread during read that would allow the application of sufficient ΔVread would have been, for example, 6+3=9V which would have been a high voltage that could lead to read disturb conditions. One example of such setting up for later compensation is depicted in FIG. 12 as the application of VreadX to the drain side neighboring world line while the other unselected word lines receive Vread. In many prior art devices, all of the unselected word lines would receive Vread. In the embodiment of FIG. 12, all of the unselected word lines except for the drain side neighbor receive Vread, while the drain side neighbor receives VreadX.

The process depicted in FIG. 16 applies to full sequence programming described above with respect to FIG. 8 in which two bits of one logical page are stored in each cell and will be read and reported out together. If the memory cell on the neighboring word line is in state E, there will be no floating gate to floating gate coupling effect. If the memory cell on the neighboring word line is in state A, there will be a small coupling effect. If the memory cell on the neighboring word line is in state B, there will be a medium floating gate to floating gate coupling effect. If the memory cell on the neighboring word line is in state C, there will be a larger floating gate to floating gate coupling effect. The exact coupling effect due to the neighboring word line varies by array implementation and can be determined by characterizing the device.

Step 370 in FIG. 16 includes performing a read operation for the neighboring word line WLn+1. This includes performing the process of FIG. 14 for the neighboring word line in one embodiment. For example, if a page in word line WL1 is being read, then step 370 includes performing the process of FIG. 14 on word line WL2. The results of step 370 are stored in the appropriate latches at step 372. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1.

At step 374, a read process is performed for the word line of interest WLn. This includes performing the process of FIG. 14 with VreadX=Vread1. In one embodiment, Vread1=Vread. Thus, all of the unselected word lines (see WL_unsel and WLn+1 of FIG. 12) are receiving Vread. This provides the maximum compensation as the compensation is determined by the difference between Vread value used on WLn+1 now during read operations and the Vread value used earlier during the verify phase of program/verify. The compensation value, compC, can be defined as follows: compC=Vread1−Vreadp=5.5−3=2.5v, where Vreadp is the Vread value used during program/verify. The results of step 374 are stored in the appropriate latches for bit lines with memory cells where neighbor cell WLn+1 was determined (at step 370) to be in state C. Therefore, the maximum compensation, CompC, is engaged for cells whose drain side neighbors had experienced the highest change in threshold voltage by being programmed from state E to state C. Note that these drain side neighbors were in State E during program/verify of WLn, but now are in State C. What has to be compensated for under all circumstances is the change in state of the drain side neighbor on WLn+1 experienced between the time of write of WLn and the present time of read of WLn. For other bit lines whose drain side neighbors are not being detected presently to be in state C, the data of this read of WLn which used Vread1 on WLn+1 will be disregarded.

At step 378, a read process is performed for WLn. During that read process, the drain side neighbor word line WLn+1 will receive Vread2. That is, VreadX=Vread2, where Vread2, as compared to Vread1, is closer in value to the Vreadp used during programming. This delivers a smaller compensation amount appropriate for cells whose drain side neighbors are now in state B. One example of a compensation amount is compB=Vread2−Vreadp=4.9−3=1.9V. Thus Vread2 differs from Vreadp by compB. At step 380, the results of step 378 will be stored for bit lines with memory cells having neighboring memory cells (e.g., WLn+1) in state B. Data for other bit lines will be disregarded.

At step 382, a read process is performed for WLn. During that read process, the drain side neighbor word line WLn+1 will receive Vread3. That is, VreadX=Vread3, where Vread3, as compared to Vread2, is closer in value to the Vreadp used during programming. This delivers a yet smaller compensation amount appropriate for cells whose drain side neighbors are now in state A. One example of a compensation amount is compA=Vread3−Vreadp=4.3−3=1.3V. Thus Vread3 differs from Vreadp by compA. At step 384, the results of step 382 will be stored for bit lines with memory cells having neighboring memory cells (e.g., WLn+1) in state A. Data for other bit lines will be disregarded.

At step 386, a read process is performed for WLn. During that read process, the drain side neighbor word line WLn+1 will receive Vread4. That is, VreadX=Vread4, where Vread4 is identical in value to Vreadp used during programming. This delivers no compensation amount which is appropriate for cells whose drain side neighbors are now in state E as they were at the time of program/verify. The compensation amount is compE=Vread4−Vreadp=3−3=0.0V. At step 388, the results of step 386 will be stored for bit lines with memory cells having neighboring memory cells (e.g., WLn+1) in state E. Data for other bit lines will be disregarded. During the process of FIG. 16, the neighboring bit line will receive four voltages; however, each selected memory cell being read will only make use of the one appropriate voltage.

In different implementations, different values of Vread1, Vread2, Vread3 and Vread4 can be determined based on device characterization, experimentation and/or simulation.

In the discussion above, the process of FIG. 16 is performed as part of the data recovery step 314 of FIG. 13. In another embodiment, the process of FIG. 16 can be used as the initial read process that is performed in response to a request to read data. For example, after receiving a request to read data at step 300 of FIG. 13, the system will perform a read operation at step 302. In this embodiment, step 302 is implemented by performing the process of FIG. 16. An embodiment that uses the process of FIG. 16 to implement step 302 may not have the additional data recovery step 314, so if an error is not correctable the system would report the error.

FIG. 17 is a flow chart indicating that the data recovery process (e.g., the method of FIG. 16) can be performed for all the word lines of a block except for the last word line to be programmed. For example, if there are x word lines, the recovery process can be used for word lines WL0 through WLx−1. It would not be necessary to perform the recovery process for word line WLx (e.g., the word line closest to the drain) because that word line has no neighbor that was programmed after it that would cause the floating gate to floating gate coupling effect. Although FIG. 17 shows an embodiment with a recovery process performed for all the word lines sequentially, in one embodiment described above with respect to FIG. 13, the recovery process can be performed for the word lines at separate times and only if there were ECC errors that were not correctable.

The above-described methods of FIGS. 14 and 16 were discussed with respect to the full sequence programming storing two bits of one logical page of FIG. 8. These processes can be slightly modified when reading data that was programmed according to the two-step process of FIG. 9 storing one bit from each of two logical pages. For example, when performing the standard read operation (step 302 of FIG. 13), reading the lower page would require applying Vra and Vrc to the control gates of the memory cells and sensing at those read points to determine whether the data is in state E/C (data 1) or states A/B (data 0) for the lower page. Thus, FIG. 14 would be modified by performing only steps 320, 322, 324 and steps 332, 334, 336, 338, and 340 for a lower page read. For performing a read of the upper page, read compare point Vrb would be used to determine whether upper page data is for state E/A (data 1) or states B/C (data 0). Therefore, for an upper page read, the process of FIG. 14 would be amended to perform only steps 326, 328, 330, 338 and 340. Additionally, when recovering data (step 314), the process would perform the method of FIG. 18 for recovering data for a lower page and the process of FIG. 19 to recover data for an upper page.

Figure 18:
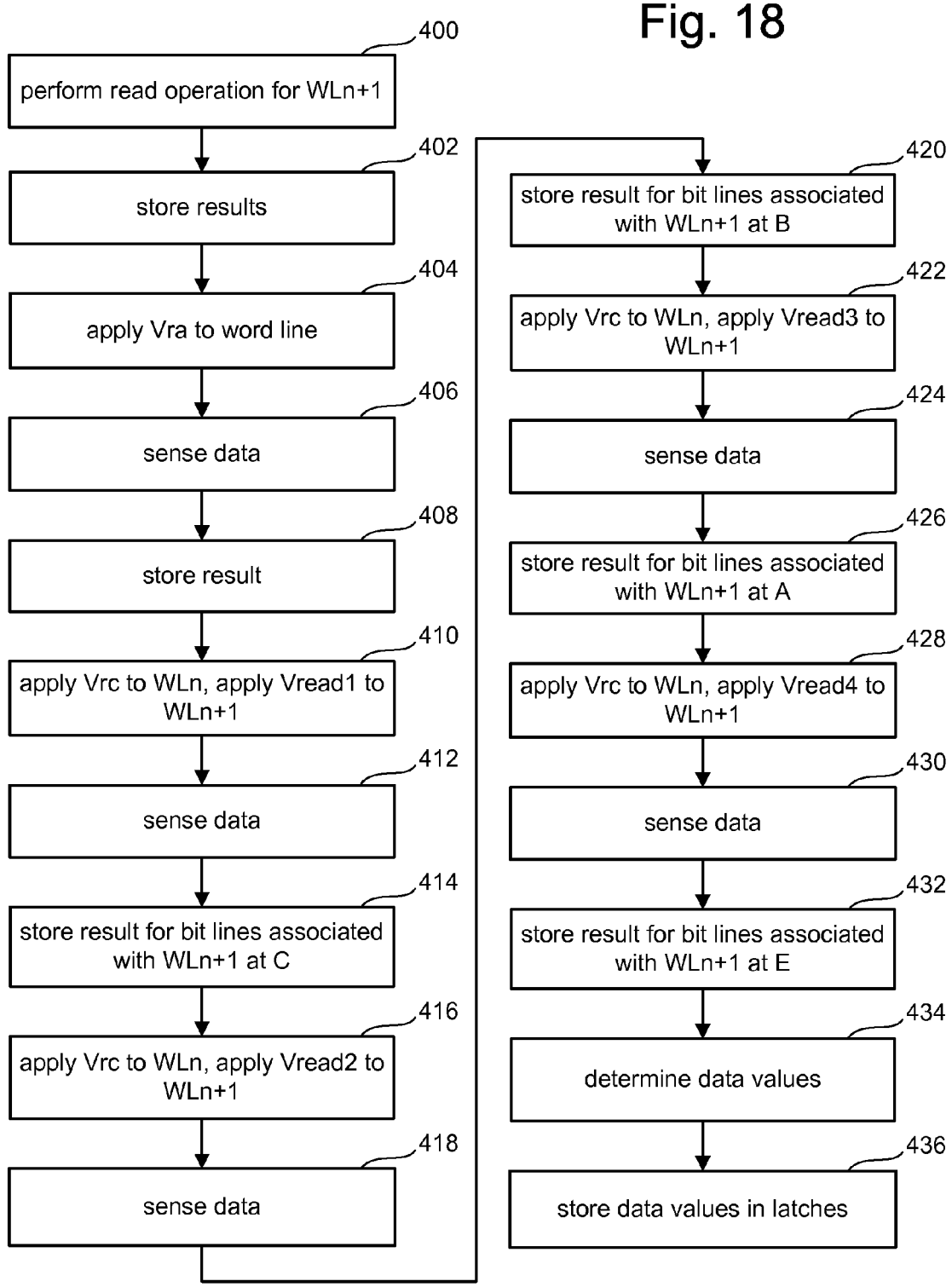
FIG. 18 is a flow chart describing one embodiment of a process for reading data from a lower page.

At step 400 of FIG. 18, a read operation is performed for the neighboring word line WLn+1. In one embodiment, the method of FIG. 14 is performed at step 400. In some embodiments, the read operation performed for WLn+1 results in determining the actual data stored on WLn+1. In other embodiments, the read operation performed for WLn+1 results in a determination of charge levels (or another condition) on WLn+1, which may or may not accurately reflect the data stored on WLn+1. The results of that read operation are stored in the appropriate latches at step 402. At step 404, a read operation is performed for the word line of interest WLn, including performing the process of FIG. 12 with Vra being applied to WLn and VreadX=Vread4. At step 406, the bit lines are sensed. At step 408, the results are stored in the appropriate latches. In another embodiment of step 404, the read process would be performed with VreadX=Vread1. In one embodiment, the value of VreadX at step 404 should be the same as used during the verification process.

At step 410, read reference voltage Vrc is applied to the word line WLn and a read operation is performed for the word line of interest WLn with VreadX=Vread1. At step 412, data is sensed as discussed above. At step 414, the results of the sense step 412 will be stored for bit lines associated with a neighboring cell storing data in state C.

At step 416, read reference voltage Vrc is applied to the word line WLn and a read operation is performed for the word line of interest WLn with VreadX=Vread2 for WLn+1. At step 418, the data will be sensed as discussed above. At step 420, the results of step 418 will be stored for bit lines associated with neighboring cells storing data in state B. Data for other bit lines will be discarded.

At step 422, read reference voltage Vrc is applied to the word line WLn and a read operation is performed for WLn with VreadX=Vread3 for WLn+1. At step 424, the data will be sensed as discussed above. At step 426, the results of step 424 will be stored for bit lines associated with neighboring cells storing data in state A. Data for other bit lines will be discarded.

At step 428, read reference voltage Vrc is applied to the word line WLn and a read operation is performed for WLn with VreadX=Vread4 for WLn+1. At step 430, the data will be sensed as discussed above. At step 432, the results of step 430 will be stored for bit lines associated with neighboring cells storing data in state E. Data for other bit lines will be discarded.

At step 434, processor 162 will determine the data values based on the data stored from the sensing steps. At step 436, the determined data values from step 434 will be stored in latches for eventual communication to the user requesting the read of data. In another embodiment, steps 404-408 associated with state A could be performed between steps 432 and 434. Other orders for performing the steps of FIG. 18, as well as the steps of other flow charts, can also be used.

Note that in the process described by FIG. 18, compensation is only applied for Vrc in order to distinguish state B from state C. It is assumed that compensation is not needed when reading at Vra because the usually negative threshold of the erase state, though affected by WLn+1, is separated sufficiently far from state A as to not need correction. While this is a practical assumption for current generation memories, it may not be true in future generation memories, and the compensation processes described with respect to Vrc may be used for Vra.

When determining the data values at step 434, if a memory cell conducts in response to Vra, the lower page data is "1." If the memory cell does not conduct in response to Vra and does not conduct in response to Vrc, then the lower page data is also "1." If the memory cell does not conduct in response to Vra, but does conduct in response to Vrc, then the lower page data is "0."

Figure 19:
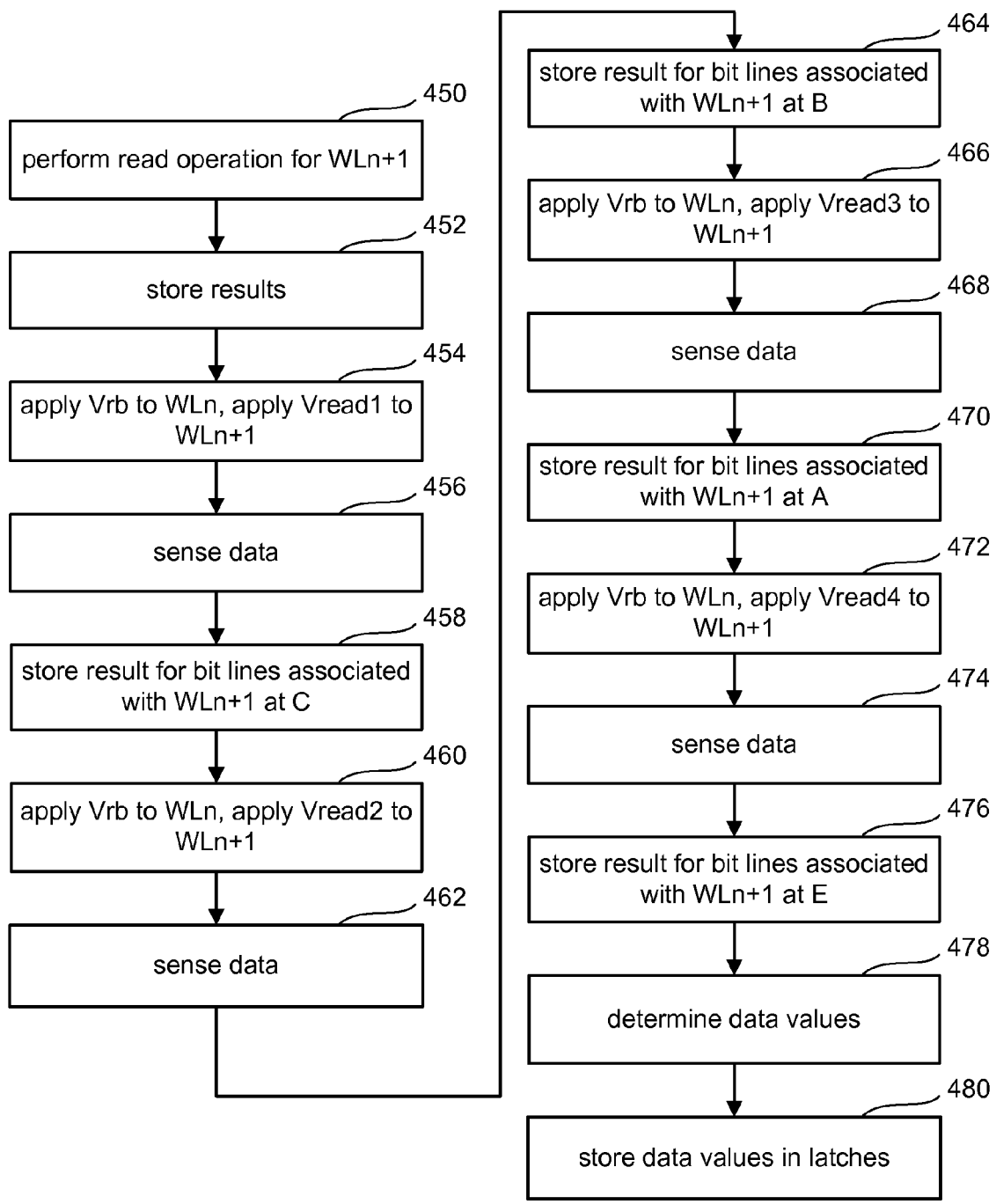
FIG. 19 is a flow chart describing one embodiment of a process of reading data from an upper page.

The process of FIG. 19 is used to read or recover data for the upper page. At step 450, a read operation is performed for the neighboring word line WLn+1. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1. At step 452, the results of step 450 are stored in the appropriate latches for each of the bit lines.

At step 454, read reference voltage Vrb is applied to the word line WLn and a read operation is performed for WLn with VreadX=Vread1 for WLn+1. In step 456, the data will be sensed as discussed above. At step 458, the results of step 456 will be stored for bit lines associated with neighboring cells storing data in state C. Data for other bit lines will be discarded.

At step 460, read reference voltage Vrb is applied to the word line WLn and a read operation is performed for WLn with VreadX=Vread2 for WLn+1. At step 462, the data will be sensed as discussed above. At step 464, the results of step 462 will be stored for bit lines associated with neighboring cells storing data in state B. Data for other bit lines will be discarded.

At step 466, read reference voltage Vrb is applied to the word line WLn and a read operation is performed for WLn with VreadX=Vread3 for WLn+1. At step 468, the data will be sensed as discussed above. At step 470, the results of step 468 will be stored for bit lines associated with neighboring cells storing data in state A. Data for other bit lines will be discarded.

At step 472, read reference voltage Vrb is applied to the word line WLn and a read operation is performed for WLn with VreadX=Vread4 for WLn+1. At step 474, the data will be sensed as discussed above. At step 476, the results of step 474 will be stored for bit lines associated with neighboring cells storing data in state E. Data for other bit lines will be discarded.

At step 478, processor 162 determines the data values based on the stored sensed data. If a memory cell turned on in response to Vrb, then the upper page data is "1." If a memory cell does not turn on in response to Vrb, then the upper page data is "0." At step 480, the data values determined by processor 162 are stored in the data latches for communication to the user.

In another embodiment, rather than using the methods of FIGS. 18 and 19 to recover data, the methods of FIGS. 18 and 19 can be used for the initial data reads performed in response to a request to read data. For example, after receiving a request to read data at step 300 of FIG. 13, the system will perform a read operation at step 302. In this embodiment, step 302 is implemented by performing the process of FIGS. 18 and/or 19. An embodiment that uses the process of FIGS. 18 and/or 19 to implement step 302 may not have the additional data recovery step 314, so if an error is not correctable the system would report the error.

FIGS. 18 and 19 are for reading data that is programmed using the upper page and lower page process of FIG. 9. These two methods of FIGS. 18 and 19 can be used to read data programmed by all bit line programming or odd/even bit line programming. When used with all bit line programming, all bit lines are typically read simultaneously. When used with odd/even bit line programming, even bit lines are typically read simultaneously at a first time and odd bit lines are typically read simultaneously possibly at a different time.

FIGS. 20-25 describe processes used to read data that is programmed according to the method associated with FIGS. 10A-10C. The process of FIG. 20 can be implemented as an overall process for reading data that is performed in response to a read request for a particular one or more pages (or other grouping) of data prior to, separate from and/or in conjunction with using ECCs. In other embodiments, the process of FIG. 20 can be performed as part of data recovery step 314 of FIG. 13. When reading data as programmed according to the process of FIGS. 10A-10C, any perturbation from floating gate to floating gate coupling due to programming the lower page of neighboring cells should be corrected when programming the upper page of the memory cell under question. Therefore, when attempting to compensate for floating gate to floating gate coupling effect from neighboring cells, one embodiment of the process need only consider the coupling effect due to the programming of the upper page of neighboring cells. Thus, in step 500 of FIG. 20, the process reads upper page data for the neighboring word line. If the upper page of the neighboring word line was not programmed (step 502), then the page under consideration can be read without compensating for the floating gate to floating gate coupling effect (step 504). If the upper page of the neighboring word line was programmed (step 502), then the page under consideration should be read using some compensation for the floating gate to floating gate coupling effect at step 506. In some embodiments, the read operation performed for a neighboring word line results in a determination of charge levels on the neighboring word line, which may or may not accurately reflect the data stored thereon. Also, note that the selected word line to be read, i.e. WLn, may itself have only lower page data. This can happen when the entire block has not yet been programmed. In such a situation it is always guaranteed that the cells on WLn+1 are still erased, and therefore, no coupling effect has yet plagued WLn cells. This means that no compensation is required. So the lower page read of a word line whose upper page has yet to be programmed can proceed as usual without the need for any compensation technique.

In one embodiment, a memory array implementing the programming process of FIGS. 10A-10C will reserve a set of memory cells to store one or more flags. For example, one column of memory cells can be used to store flags indicating whether the lower page of the respective rows of memory cells has been programmed and another column of memory cells can be used to store flags indicating whether the upper page for the respective rows of memory cells has been programmed. In some embodiments, redundant cells can be used to store copies of the flag. By checking the appropriate flag, it can be determined whether the upper page for the neighboring word line has been programmed. More details about such a flag and the process for programming can be found in U.S. Pat. No. 6,657,891, Shibata et al., "Semiconductor Memory Device For Storing Multi-Valued Data," incorporated herein by reference in its entirety.

Figure 20:
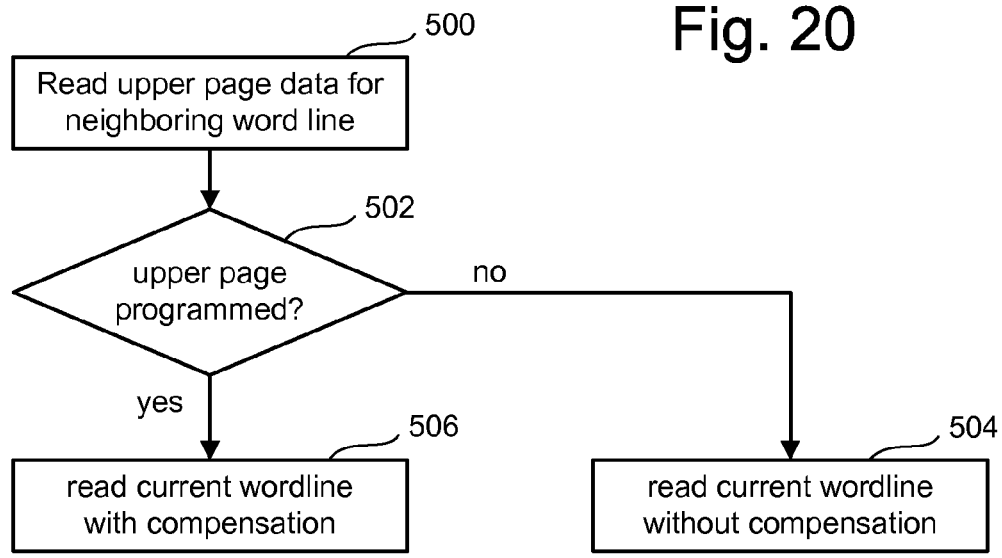
FIG. 20 is a flow chart describing one embodiment of a process for reading data.
Figure 21:
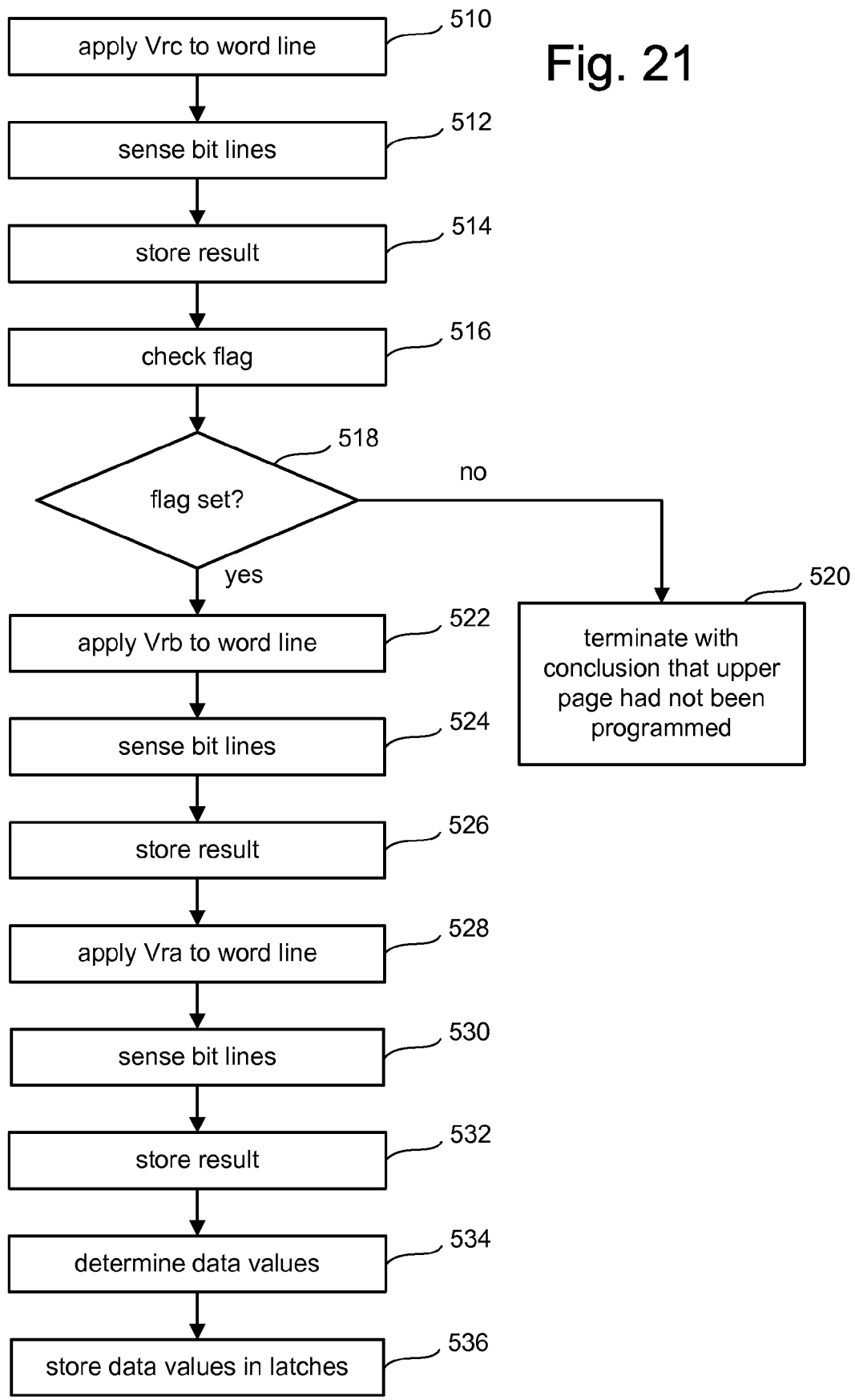
FIG. 21 is a flow chart describing one embodiment of a process for reading data from an upper page.

FIG. 21 describes one embodiment of a process for reading the upper page data for a neighboring word line such as the drain side neighbor (step 500 of FIG. 20). At step 510, read reference voltage Vrc is applied to the word line associated with the page being read. At step 512, the bit lines are sensed as described above. At step 514, the results of step 512 are stored in the appropriate latches. At step 516, the system checks the flag indicating upper page programming associated with the page being read. In one embodiment, the memory cell storing the flag will store data in state E if the flag is not set and in state C if the flag is set. Therefore, when that particular memory cell is sensed at step 512, if the memory cell conducts (turns on), then the memory cell is not storing data in state C and the flag is not set. If the memory cell does not conduct, then it is assumed in step 516 that the memory cell is indicating that the upper page has been programmed.

In another embodiment, the flag can be stored in a byte. Rather than storing all bits in state C, the byte will include a unique 8-bit code representing the flag and known to the state machine 312, such that the 8-bit code has at least one bit in state E, at least one bit in state A, at least one bit in state B and at least one bit in state C. If the upper page has not been programmed, the byte of memory cells will all be in state E. If the upper page has been programmed, then the byte of memory cells will store the code. In one embodiment, step 516 is performed by checking whether any of the memory cells of the byte storing the code do not turn on in response to Vrc. In another embodiment, step 516 includes addressing and reading the byte of memory cells storing the flag and sending the data to the state machine, which will verify whether the code stored in the memory cells matches the code expected by the state machine. If so, the state machine concludes that the upper page has been programmed.

If the flag has not been set (step 518), then the process of FIG. 21 terminates with the conclusion that the upper page has not been programmed. If the flag has been set (step 518), then it is assumed that the upper page has been programmed and at step 522 voltage Vrb is applied to the word line associated with the page being read. At step 524, the bit lines are sensed as discussed above. At step 526, the results of step 524 are stored in the appropriate latches. At step 528, voltage Vra is applied to the word line associated with the page being read. At step 530, the bit lines are sensed. At step 532, the results of step 530 are stored in the appropriate latches. At step 534, processor 162 determines the data value stored by each of the memory cells being read based on the results of the three sensing steps 512, 524 and 530. At step 536, the data values determined in step 534 are stored in the appropriate data latches for eventual communication to the user. At step 534, processor 162 determines the values of the upper page and lower page data using well known simple logic techniques dependent on the specific state coding chosen. For example, for the coding described in FIG. 10A-10C, the lower page data is Vrb* (the complement of the value stored when reading at Vrb), and the upper page data is Vra* OR (Vrb AND Vrc*).

In one embodiment, the process of FIG. 21 includes the application of Vread to the drain side neighboring word line. Therefore, VreadX=Vread for the process of FIG. 21. In another embodiment of the process of FIG. 21, VreadX=Vread4.

Figure 22:
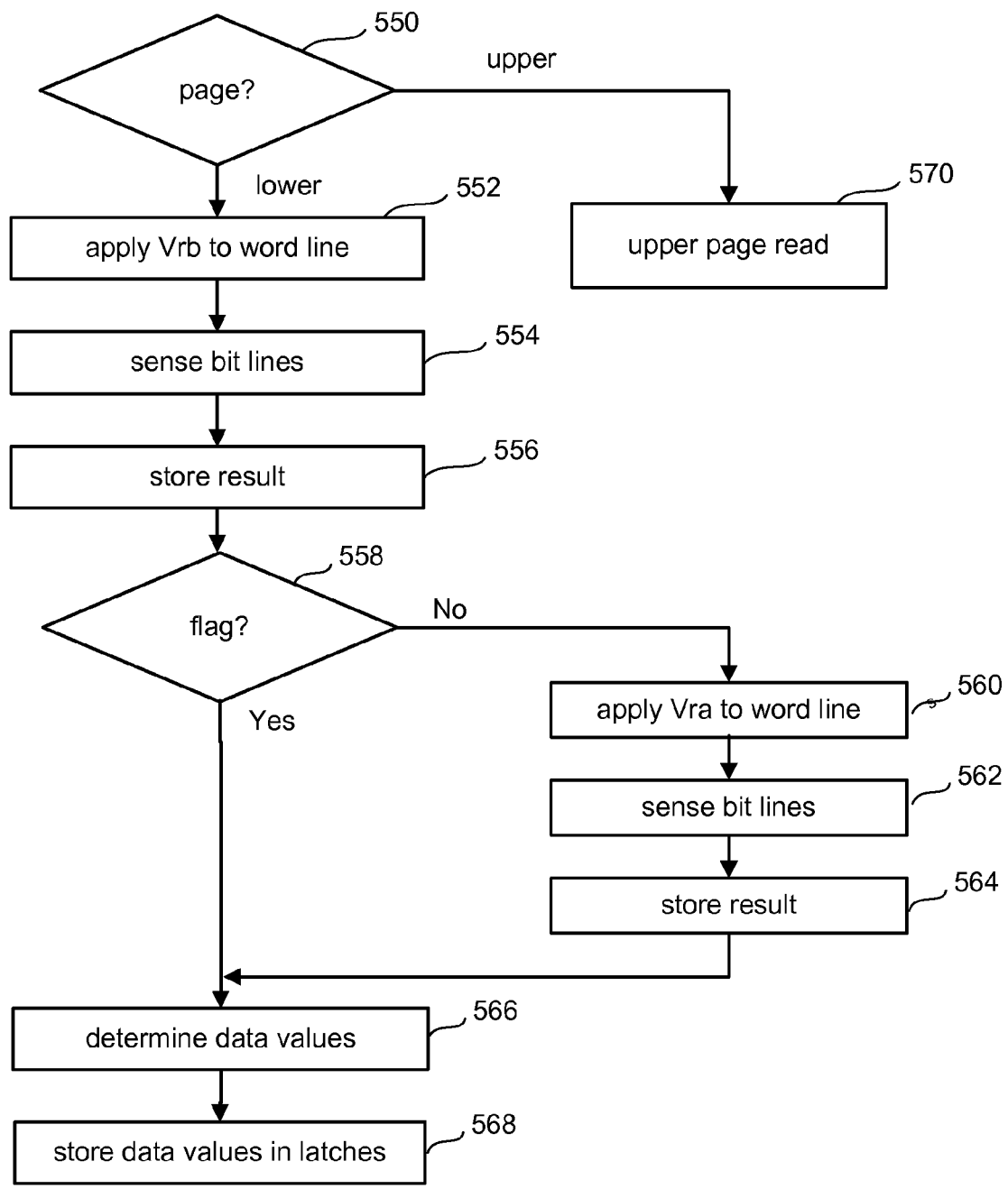
FIG. 22 is a flow chart describing one embodiment of a process for reading data without using compensation.

FIG. 22 is a flow chart describing one embodiment of a process for reading data of the word line under consideration when the system does not need to compensate for floating gate to floating gate coupling from a neighboring word line (see step 504 of FIG. 20). At step 550, it is determined whether the read is for the upper page or lower page associated with the word line under consideration. If the read is for the lower page, then in step 552 voltage Vrb is applied to the word line associated with the page being read. At step 554, the bit lines are sensed. At step 556, the results of sensing step 554 are stored in the appropriate latches. At step 558, the flag is checked to determine if the page contains upper page data. If there is no flag, then any data present will be in the intermediate state and Vrb was the incorrect comparison voltage to use. The process continues at step 560 where Vra is applied to the word line. The bit lines are re-sensed at step 562, and in step 564 the result is stored. At step 566, processor 162 determines a data value to be stored. In one embodiment, when reading the lower page, if the memory cell turns on in response to Vrb (or Vra) being applied to the word line, then the lower page data is "1"; otherwise, the lower page data is "0."

If it is determined that the page address corresponds to the upper page (step 550), an upper page read process is performed at step 570. In one embodiment, the upper page read process of step 570 includes the same method described in FIG. 21, which includes reading the flag and all three states since an unwritten upper page may be addressed for reading, or another reason.

In one embodiment, the process of FIG. 22 includes the application of Vread to the drain side neighboring word line. Therefore, VreadX=Vread for the process of FIG. 22. In another embodiment of the process of FIG. 21, VreadX=Vread4.

Figure 23:
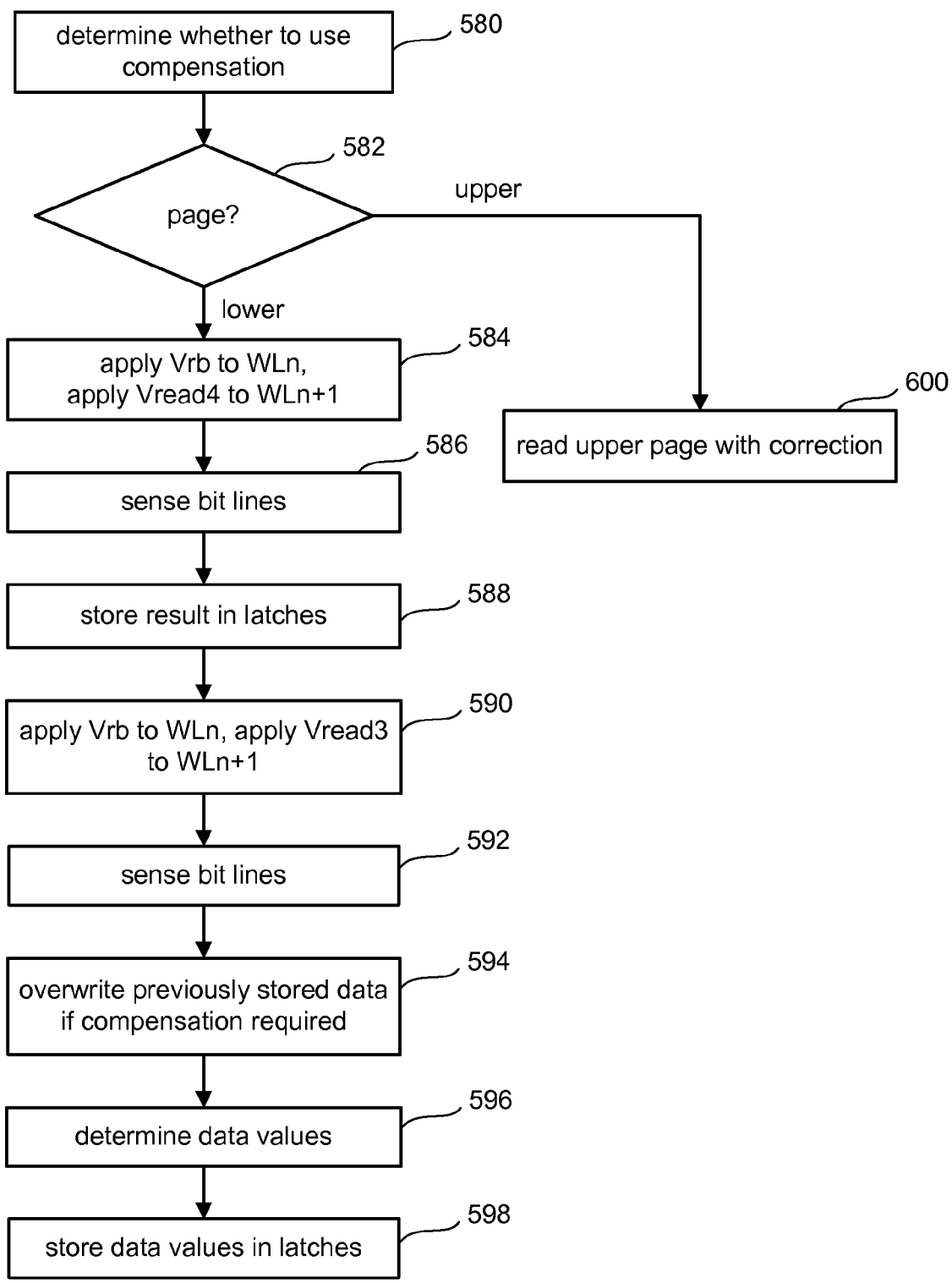
FIG. 23 is a flow chart describing one embodiment of a process for reading data while compensating for floating gate to floating gate (or dielectric region to dielectric region) coupling.

FIG. 23 depicts a flow chart describing one embodiment of a process for reading data while compensating for floating gate to floating gate coupling (see step 506 of FIG. 20). At step 580 of FIG. 23, the system determines whether to use compensation for the floating gate to floating gate coupling. This is performed separately for each bit line. The appropriate processor 162 will determine which bit lines need to use the compensation based on the data from the neighboring word lines. If a neighboring word line is in state E or B (or has charge apparently indicating state E or B), then the particular word line being read need not compensate for the floating gate to floating gate coupling effect. The assumption is that if it is in state E it hasn't contributed to any coupling because the threshold hasn't moved since the current word line was written. If it is in state B, it got there from B', and the movement from B' to B is small and can be neglected. In another embodiment, the small movement from state B' to state B can be compensated for by the application of a proportionately small ΔVread.

In one embodiment, the process of step 580 can be performed concurrently with step 500. For example, FIG. 24 provides a chart explaining steps to perform a determination whether to use an offset for a particular bit line. The first step is to perform a read process using Vra on the word line. The second step is to perform a read using Vrb. When reading at Vra, a latch stores a 1 if the memory cell is in state E and a 0 if the memory cell is in states A, B, C or. When reading at Vrb, the latch will store a 1 for states E and A, and store a 0 for states B and C. The third step of FIG. 24 includes performing an XOR operation on the inverted results from the second step with the results from step 1. In the fourth step, a read is performed using Vrc at the word line. A latch stores a 1 for states E, A and B, and stores a 0 for state C. In the fifth step, the results of step 4 and step 3 are operated by a logical AND operation. Note that steps 1, 2 and 4 may be performed as part of FIG. 21. Steps 3 and 5 of FIG. 24 can be performed by dedicated hardware or by processor 162. The results of step 5 are stored in a latch with 1 being stored if no compensation is needed and 0 being stored if compensation is needed. Thus, a compensation will be required for those cells that are read on WLn that have neighboring memory cells on WLn+1 that are in the A or C state. This approach requires only one latch to determine whether to correct WLn or not, in contrast to some previous methods that store the full data from WLn+1, requiring two or more latches.

As mentioned previously, the lower Vreadp applied to WLn+1 during program verify for WLn may be reduced to about 4.5V in one embodiment that implements the programming technique of FIGS. 10A-10C. To apply no compensation for floating gate coupling when reading at WLn, such as where the neighboring memory cell is in state E or B, VreadX=Vread4 can be applied to WLn+1, where Vread4 is equal to Vreadp (4.5V) that was applied to WLn+1 during program verify for WLn. If a small compensation is to be used in an implementation to compensate for neighboring cells that are in state B, a VreadX of about 5V can be applied to WLn+1 to effect a compensation of 0.5V. In FIGS. 23 and 25, a compensation for this movement is not illustrated but would be applied as described. To apply a compensation based on a neighboring memory cell in state A or state C, VreadX=Vread3 can be applied to WLn+1 where Vread3 is equal to about 6V. This will provide a 1.5V (6V−4.5V) compensation.

Looking back at step 582 of FIG. 23, it is determined whether the page being read is the upper page or lower page. If the page being read is the lower page, then Vrb is applied to the word line WLn associated with the page being read and Vread4 is applied to the drain side neighbor word line WLn+1 during a read process in step 1204. Note that for the state coding described in FIG. 10A-10C, reading at Vrb is sufficient to determine the lower page data. At step 588, the results of sensing out step 586 are stored in the appropriate latches associated with the bit lines. At step 590, Vrb will be applied to the word line WLn for the page being read and Vread3 is applied to the drain side neighbor word line WLn+1 during a read process (e.g., see FIG. 12). At step 592, the bit lines are sensed. At step 594, the results of the sensing of step 592 are used to overwrite the results stored in step 588 for the bit lines for which it was determined at step 580 to use compensation. If the particular bit line is determined not to have to use compensation, then the data from step 592 is not stored. At step 596, processor 162 will determine whether the data is 1 or 0 for the lower page. If the memory cell turned on in response to Vrb, then the lower page data is 1; otherwise, the lower page data is 0. At step 598, the lower page data is stored in the appropriate latches for communication to the user.

If it is determined at step 582 that the page being read is the upper page, then the upper page correction process is performed at step 600. FIG. 25 provides a flow chart describing the upper page correction process. At step 610 of FIG. 25, read reference voltage Vrc is applied to the word line associated with the page being read and Vread4 is applied to the drain side neighbor word line WLn+1 as part of a read process. At step 612, the bit lines are sensed. At step 614, the results of the sensing step are stored in the appropriate latches. At step 616, Vrc is applied to the word line associated with the page being read and Vread3 is applied to the drain side neighbor word line WLn+1 as part of a read process. At step 618, the bit lines are sensed. At step 620, the results of the sensing step 618 are used to overwrite the results stored in step 614 for any bit line for which the compensation is required (see step 580).

At step 622, Vrb is applied to the word line and Vread4 is applied to the drain side neighbor word line WLn+1 during a read process. At step 624, the bit lines are sensed. At step 626, the results of sensing step 624 are stored. At step 628, Vrb is applied to the word line associated with the page being read and Vread3 is applied to the drain side neighbor word line WLn+1 during a read process. At step 630, the bit lines are sensed. At step 632, the results of step 630 are used to overwrite the results stored at step 626 for those bit lines for which the compensation is required (see step 580).

At step 634, Vra is applied to the word line associated with the page being read and Vread4 is applied to the drain side neighbor word line WLn+1 as part of a read process. At step 636, the bit lines are sensed. At step 638, the results of the sensing step 636 are stored in the appropriate latches. At step 640, Vra is applied to the word line associated with the page being read and Vread3 is applied to the drain side neighbor word line WLn+1 as part of a read process. At step 642, the bit lines are sensed. In step 644, the results of step 642 are used to overwrite the results stored in step 638 for those bit lines for which the compensation is required (see step 580). In step 646, the processor 162 determines the data values in the same manner as previously described another method known in the art. At step 648, the data values determined by the processor 162 are stored in the appropriate data latches for communication to the user. In other embodiments the order of reading (Vrc, Vrb, Vra) may be changed.

In the above discussion with respect to FIG. 20, an example is discussed involving the reading of a page of data. It is likely, but not required, that a request to read data will require the reading of multiple pages of data. In one embodiment, to speed up the process of reading multiple pages of data, the read process will be pipelined such that the state machine will execute a next page sensing while the user is transferring out the previous page of data. In such an implementation, the flag fetch process may interrupt the pipelined read process. To avoid such an interruption, one embodiment contemplates reading the flag for a given page when that page is read and using the wired-OR detection process to check the flag (rather than reading the flag and sending it to the state machine). For example, during step 500 of FIG. 20 (reading the neighboring word line), the process first reads data using Vrc as the reference voltage. At that point, if the wired-OR line indicates that each state stores data 1, then the upper page has not been programmed; therefore, no compensation is needed and the system will read without compensating for the floating gate to floating gate coupling (step 504). If the flag is a one-byte code that includes data in each data state, at least the flag memory cells would have data in state C if the flag is set. If the wired-OR line indicates that no memory cells have data in state C, then the state machine concludes that the flag has not been set; therefore, the upper page for the neighboring word line has not been programmed and compensation for floating gate coupling is not needed. More information about performing pipelined reads can be found in U.S. patent application Ser. No. 11/099,133, titled "Compensating for Coupling During Read Operations of Non-Volatile Memory," Inventor Jian Chen, filed on Apr. 5, 2005, incorporated herein by reference in its entirety.

When the objective is to read data on WLn, it may not be necessary to have an ECC correct read of WLn+1, as bits that are read erroneously are most probably bits at tails of distributions, and to have mistaken them as belonging to another data state does not cause a big error in determining the required amount of compensation for reading the corresponding cell(s) on WLn. For example, a slightly over programmed cell on WLn+1 which was meant to be programmed to State B, having subsequently experienced the capacitive coupling effect during programming of WLn+2, may now be misread as being in state C when WLn+1 is read without coupling compensation (step 370 of FIG. 16) as part of the reading process of WLn. This misreading may not be an issue for the following reasons: 1) the objective is not to read data on WLn+1, 2) the correction applied for read of corresponding cell on WLn based on apparent state of cell on WLn+1 being C-state is actually a better correction than one that would have been based on the correct read of cell on WLn+1, namely state B. This is because all the causes for the cell on WLn+1 being misread as being in state C, whether they be over-programming in the first place, or subsequent coupling from WLn+2 cell, are presently at work to induce stronger coupling effect induced by WLn+1 cell and experienced by WLn cell. Faced with this stronger coupling experienced by cell on WLn it may actually be better to apply the correction corresponding to WLn+1 cell being in state C, rather than state B.

In some instances, misreading the current apparent state of memory cells of a neighboring word line WLn+1 may negatively impact read operations for a selected word line. Accordingly, one embodiment provides margined read reference voltages for reading a neighboring word line. The margined values may provide more accurate results when sensing at the neighboring word line and/or improve the results when reading the selected word line based on this information. As mentioned above, the objective when reading WLn+1 is not to determine the actual data stored by the memory cells at WLn+1, but rather, the apparent state of the memory cells at WLn+1 existing at the time of reading WLn. Any change in threshold voltage of the cells at WLn+1 since programming WLn+1 may be beneficial to detect when reading the data for WLn because that change will affect the apparent threshold voltage of the cells at WLn during the immediate read operation for WLn. It is important to note that misreading as used in the concept for reading at WLn+1 to provide an appropriate compensation when reading WLn refers to misreading the apparent state of the cells at WLn+1 as existing at the time of reading WLn. This is different than misreading the data that was originally programmed into a cell which is the ultimate objective of the WLn read, but not the WLn+1 read. It is important to appropriately categorize the apparent state of the cells at WLn+1 when attempting to read WLn, rather than categorizing the actual state to which they were originally programmed.

Consider the read process for a drain side neighboring word line WLn+1 that is performed as part of reading a selected word line WLn. When word line WLn+1 was programmed, a read pass voltage Vreadp was applied to word line WLn+2 (the drain side neighboring word line of WLn+1) when verifying WLn+1. Vreadp is a low read pass voltage. As previously described, Vreadp may be equal to Vread4 in some embodiments. The low value of Vreadp enables compensation during later read operations by increasing the read pass voltage from Vreadp to either Vread3, Vread2, or Vread1 based on the state of a neighboring cell.

A low value of Vreadp can be used as the pass voltage on the drain side because, during program verification, the drain side neighboring word line is guaranteed to not be fully programmed. In the case of full sequence (FIG. 8) or standard upper/lower page programming (FIG. 9), WLn+2 will be erased. In the programming technique of FIGS. 10A-10C, the drain side neighboring word line is at most partially programmed. Accordingly, a low read pass voltage is sufficient to guarantee that the memory cells of WLn+2 are on when verifying the cells of WLn+1.

When later performing an uncompensated read operation at WLn+1 for reading WLn, a larger value of the read pass voltage may be used for WLn+2. Since programming WLn+1, the state of memory cells on WLn+2 may have changed as a result of their programming. These cells may now be in any programmed state and the guarantees present during programming are no longer applicable. Accordingly, a larger read pass voltage is applied to ensure that every memory cell turns on, regardless of state. Typically, every word line except WLn+1 (receiving Vcgr) will receive Vread during the uncompensated read at WLn. Vread will be set to its highest value to ensure conduction of all cells. For example, a Vread equal to Vread1 will likely be used.

The change in the read pass voltage applied to WLn+2 between verifying and reading the cells at WLn+1 may cause a negative shift in the apparent threshold voltage of the memory cells at WLn+1. A portion of the word line voltage at WLn+2 will couple to the floating gates of the memory cells at WLn+1 during program verification and reading. Because a positive increase in the word line voltage at WLn+2 occurs between verifying and reading, the threshold voltage of the memory cells at WLn+1 may appear to decrease.

This type of change in apparent threshold voltage is illustrated in FIG. 26, which depicts a distribution of threshold voltages for a set of memory cells such as those connected to a particular word line of a memory array. The set of memory cells has undergone programming to place each memory cell in either state E, state A, state B, or state C. Distribution 701 is the distribution of threshold voltages of memory cells in state E. Distribution 702 is the distribution of threshold voltages of memory cells in state A. Distribution 706 is the distribution of threshold voltages of memory cells in state B. Distribution 710 is the distribution of threshold voltages of memory cells in state C. Distributions 701, 702, 706, and 710 represent the actual threshold voltage distributions at the completion of programming as would be seen by a sense amplifier verifying the memory cells for the programming operation.

A second set of distributions is depicted by the broken lines in FIG. 26. These distributions of threshold voltages represent the threshold voltages of the memory cells as may be seen by a sense amplifier during a read operation conducted subsequent to programming and verification. More specifically, the second set of distributions represents the apparent threshold voltages of memory cells of a neighboring word line WLn+1 as read without compensation when determining information for reading a selected word line WLn. Distribution 700 is the distribution of apparent threshold voltages of the memory cells in state A. Distribution 704 is the distribution of apparent threshold voltages of the memory cells in state B. Distribution 708 is the distribution of apparent threshold voltages of the memory cells in state C. A second distribution is not depicted for erased state E although this state may experience a similar shift in apparent threshold voltages.

The apparent threshold distributions of the second set are shifted down in comparison to the actual threshold voltage distributions of the first set. When reading a neighboring word line WLn+1, the larger read pass voltage applied to its neighboring word line WLn+2 may decrease the apparent threshold voltages of the memory cells at WLn+1. A portion of the larger positive bias applied to word line WLn+2 will be capacitively coupled to the floating gate of the memory cells at WLn+1. This capacitively coupling based on the larger positive voltage at WLn+2 may decrease the apparent threshold voltage of the memory cells at WLn+1.

Two sets of levels for the read reference voltages are depicted in FIG. 26 in accordance with one embodiment of the present disclosure. In FIG. 26, the values of the read reference voltages are margined below the levels used for reading the selected word line WLn. A first value Vra1 of the read reference voltage Vra corresponding to programmed state A is used when reading a selected word line. When reading a neighboring word line to determine information that is used for reading the selected word line, a second value Vra2 of the read reference voltage Vra is used. A first value Vrb1 of the read reference voltage Vrb corresponding to state B is used when reading a selected word line WLn. When reading neighboring world line WLn+1, a second value Vra2 of the read reference voltage Vrb is used. A first value Vrc1 of the read reference voltage Vrc corresponding to programmed state C is used when reading the selected word line WLn. A second value Vrc2 is used when reading the neighboring word line WLn+1 as part of the process of reading the selected word line.

Figure 27:
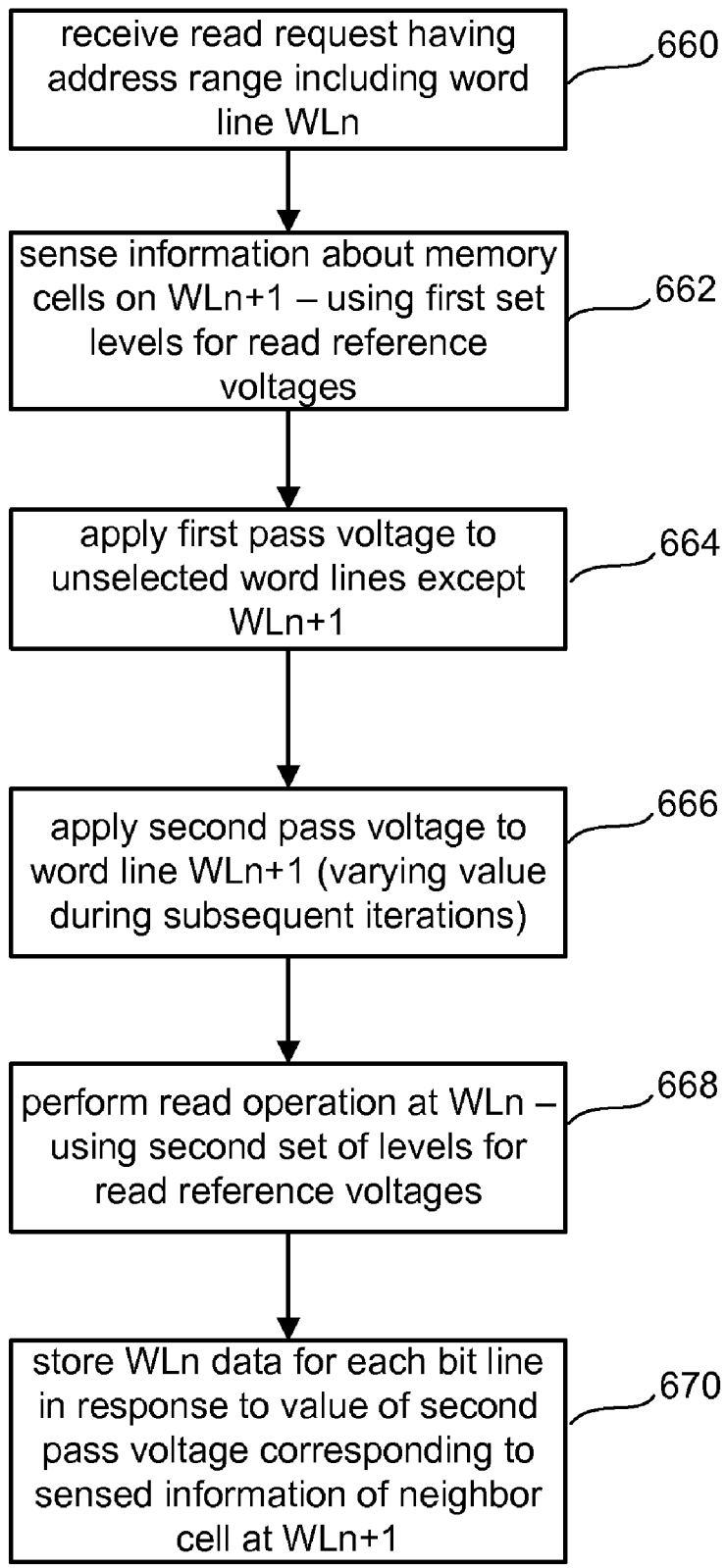
FIG. 27 is a flowchart depicting one embodiment of a process for reading neighboring cells using a different set of read reference voltages.

The principals of a read operation for a neighboring word line using margined read reference voltages are illustrated in FIG. 27. FIG. 27 is a flowchart depicting the steps for reading a selected word line WLn of a block of memory cells. At step 660, a request to read data is received. The range of addresses corresponding to the requested data includes data stored in a word line WLn. At step 662, information from the memory cells at WLn+1 is sensed using a first set of values for the read reference voltages. For example, the read reference voltage levels Vra2, Vrb2, and Vrc2 are used in one embodiment. At step 664, a first pass voltage is applied to each unselected word line of the block. At step 666, a second pass voltage is applied at a first level to word line WLn+1 that neighbors the selected word line WLn being read.

The read operation at WLn is then performed in step 668 using a second set of levels for the read reference voltages. For example, Vra1, Vrb1, and Vrc1, corresponding to states A, B, and C, respectively, can be applied to the selected word line and the bit line sensed under each application. As will be more fully described hereinafter, the first set of levels used at WLn+1 may be margined above or below the levels used at the selected word line WLn.

Four sub-reads are performed in one embodiment by iteratively repeating steps 664, 666, and 668. During each iteration, a different value of the second pass voltage is applied to WLn+1 at step 666 while sensing the conduction of the bit lines to provide a compensation based on the floating gate coupling effects of word line WLn+1 on word line WLn. A first value corresponds to memory cells of WLn+1 in state E. A second value corresponds to memory cells of WLn+1 in state A. A third value corresponds to memory cells of word line WLn+1 in state B. A fourth value corresponds to memory cells of word line WLn+1 in state C. At step 670, the WLn data is stored. For bit lines having a neighboring memory cell at WLn+1 in state E, the results of sensing at step 668 while applying the second pass voltage at the first value are stored. For bit lines having a neighboring memory cell at WLn+1 in state A, the results of sensing at step 668 while applying the second pass voltage at the second value are stored. For bit lines having a neighboring memory cell at WLn+1 in state B, the results of sensing at step 668 while applying the second pass voltage at the third value are stored. For bit lines having a neighboring memory cell at WLn+1 in state C, the results of sensing at step 668 while applying the second pass voltage at the fourth value are stored.

Figure 28:
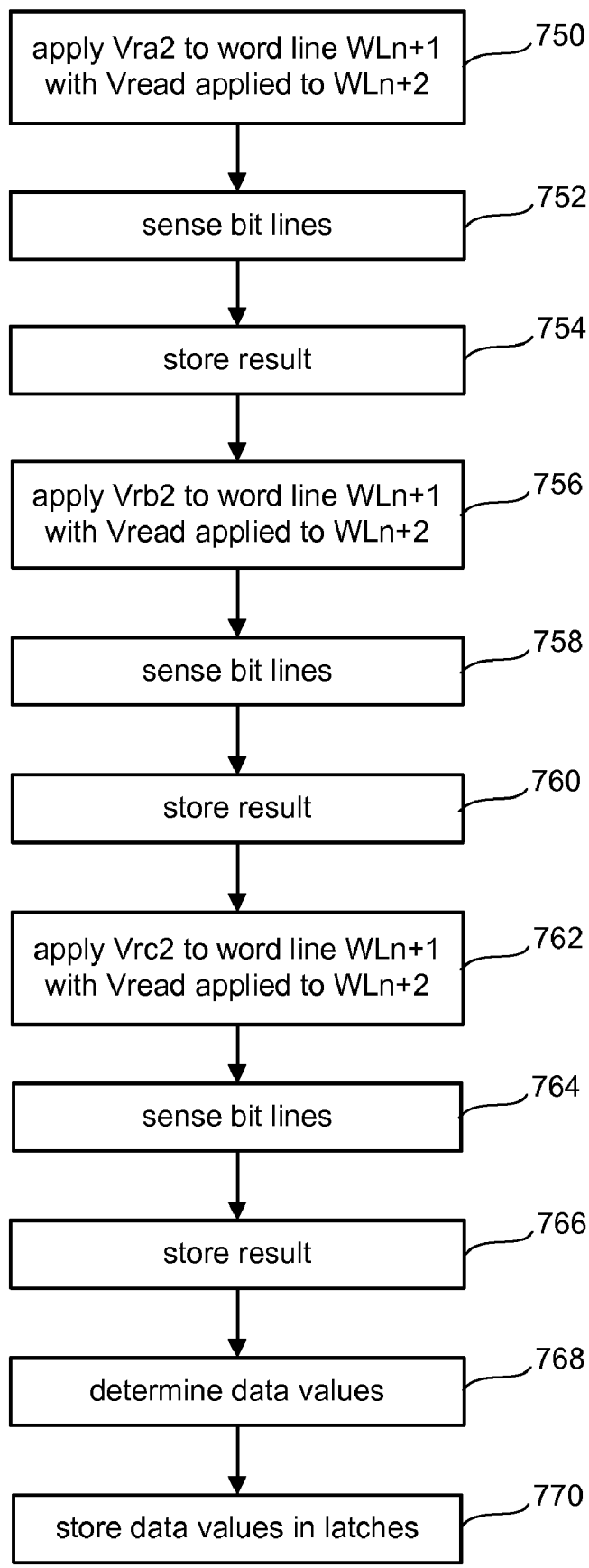
FIG. 28 is a flowchart depicting one embodiment of a process for reading a neighboring word line using a different set of read reference voltages.

FIG. 27 depicted an overview illustrating the use of one set of read reference voltage levels at WLn and a different set at WLn+1. FIG. 28 is a flowchart depicting a particular process of reading a neighboring word line as part of the read process for a selected word line WLn in accordance with one embodiment. The method of FIG. 28 can be performed for step 370 of FIG. 16, step 400 of FIG. 18, and step 450 of FIG. 19 in one embodiment.

A margined value Vra2 of the state A read reference voltage is applied to WLn+1 at step 750. While Vra2 is applied to WLn+1, the read pass voltage Vread is applied to each remaining word line of the selected block. During the read operation, a large value of Vread, typically Vread1, will be used to ensure that any programmed cells receiving the pass voltage turn on to enable sensing of just those cells at WLN+1. Vread1 is a larger value of the read pass voltage than used when verifying programming of WLn+1. A lower read pass voltage of Vreadp (e.g., Vread4) was used during verification as earlier described. The voltage level of Vra2 is chosen so as to compensate for the coupling effects associated with the increase in the read pass voltage.

The bit lines are sensed at step 752 to determine if the addressed memory cells conduct under application of Vra2 to their control gates. A conductive bit line indicates that the addressed memory cell of that bit line turned on and thus, has a threshold voltage below Vra2 (e.g. in state E). At step 754, the result of sensing the bit lines is stored in the appropriate latches for those bit lines.

A margined value Vrb2 of the state B read reference voltage is applied to WLn+1 at step 756 while Vread is applied to reach remaining word line. At step 758, the bit lines are sensed as described for application of the Vra2 read reference voltage level. At step 760, the results are stored in the appropriate latches for the bit lines. At step 762, a margined value Vrc2 of the state C read reference voltage is applied to WLn+1 while applying Vread to each remaining word line. The bit lines are again sensed at step 764 to determine which are conductive and thus, indicative of a cell with a threshold voltage below the applied level Vrc2. At step 766, the results are stored in the appropriate latches for the bit lines.

At step 768, the data values for each bit line are determined. A cell that is conductive at Vrb2 and Vrc2, but not at Vra2 is in state A. A cell that conducts at Vrc2 but not Vrb2 or Vra2 is in state B. If the cell does not conduct at any of the applied read reference voltage values, it is in state C. In one embodiment, the data values are determined by processor 162. At step 770, processor 162 stores the determined data values in the appropriate latches for each bit line. In FIG. 28, the actual data values of for WLn+1 are determined. In other embodiments, reading the neighboring word line with margined read reference voltages can determine charge levels or other condition information for WLn+1, which may or may not accurately reflect the data stored on WLn+1.

Similar techniques can be used when performing an upper page read of a neighboring word line, as described with respect to FIG. 21. The upper page read of a neighboring word line may be performed as part of the process for reading a selected word line that was programmed according to the technique illustrated in FIGS. 10A-10C. When applying the state C read reference voltage at step 510, the state B read reference voltage at step 522, and/or the state A read reference voltage at step 528, margined reference voltages are used. For example, the reference voltages Vra2, Vrb2, and/or Vrc3 can be used in one embodiment.

The read reference voltages for a word line neighboring a selected word line can be margined in various manners in different embodiments. For example, the values of the read reference voltages applied to the neighboring word line (e.g., WLn+1) may be margined to lower levels than the levels applied to the selected word line WLn as illustrated in FIG. 26. In another embodiment, the values applied to the neighboring word line are margined to higher levels than the levels applied to the selected world line. For example, cells of an erased distribution may increase in apparent or actual threshold voltage over time. Programming of other cells (e.g., of the same word line) may inadvertently shift the voltage of the erased cells leading to a distribution at higher voltages than when the erase operation was performed for these cells. Accordingly, the read reference voltage for state A when reading a neighboring word line may be shifted up when compared with the reference voltage used when reading a selected word line.

Any number of the read reference voltages in a set of read reference voltages (e.g., Vra, Vrb, and Vrc) may be margined for the WLn+1 read. For example, a margined value may only be used for one reference voltage (e.g., Vra) or two reference voltages (e.g., Vrb and Vrc). Other combinations can also be used, such as margining some read reference voltages to higher levels and others to lower levels.

The margined values of the read reference voltages applied to the neighboring word line may be margined relative to different values or parameters. For example, one embodiment provides a margined read reference voltage for a neighboring word line by adjusting the value of the corresponding read reference voltage applied to a selected word line WLn. For example, Vra2 will be offset from the level of Vra1, etc. In other embodiments, the read reference voltage(s) for a neighboring word line is margined relative to the threshold voltages of the states neighboring the reference voltage. More details regarding the margined values are provided hereinafter.

In FIG. 26, the second set of levels for the read reference voltages are margined relative to the first set of levels used at WLn. Vra2 is offset from Vra1 by a particular amount, Vrb2 is offset from Vrb1 by a particular amount, and Vrc2 is offset from Vrc1 by a particular amount. The offsets may or may not be the same for each state. For example, Vra2 may be offset from Vra1 by more than the offset of Vrb2 from Vrb1.

FIG. 29 depicts an embodiment for margining the read reference voltages that is not based on the original read reference voltage used when reading at WLn. Factors such as retention loss and relaxation (positive shifts in threshold voltage) can affect the state read from a memory cell. When it is desired to read the data stored in a cell at WLn, the read reference levels that are used are typically chosen so that these factors don't influence the state read from the cells. The read operation does not want to detect this retention loss or relaxation, as the read operation wants to determine the state to which the cell was originally programmed. When reading at WLn+1 to provide an appropriate compensation for WLn, however, detecting changes in threshold voltage due to these factors may be desired. For instance, if the apparent state or threshold voltage of a cell at WLn+1 has shifted since it was programmed, detecting this shift (or detecting the current apparent state of that cell) is beneficial. This shift will affect the apparent threshold voltage of the cells at WLn. Since the actual data is desired for WLn, providing a compensation that takes into account the shifts at WLn+1 can lead to better results at WLn.

The threshold voltage distributions 701, 702, 706, and 710 for a programmed set of memory cells are again depicted in FIG. 29, along with shifted distributions 700, 704, and 708. The Vra1 state A read reference voltage, Vrb1 state B read reference voltage, and Vrc1 state C read reference voltage are also depicted. FIG. 29 further depicts a mean threshold voltage level between each of the states. This mean threshold level can be defined in various ways as hereinafter described. Vma is a mean threshold voltage corresponding to states E and A. Vmb is a mean threshold voltage corresponding to states A and B. Vmc is a mean threshold voltage corresponding to states B and C.

The read reference voltage levels used when sensing the neighboring word line WLn+1 are depicted at Vra2 for state A, Vrb2 for state B, and Vrc2 for state C. These read reference voltages are margined relative to the mean threshold voltage levels Vma, Vmb, and Vmc noted above. This should be contrasted with the second set of read reference voltage levels for the neighboring word line in FIG. 26. In that embodiment, the second set of read reference voltage levels were margined relative to the first set of read reference voltages. This may prove significant in certain scenarios as described.

The read reference voltage levels used when reading a selected word line may not be provided at a midpoint between the adjacent memory state voltage distributions. In FIG. 21, for example, Vrb and Vrc are each provided at a level closer to the lower state voltage distribution. Vrb is closer to state A than state B and Vrc is closer to state B than state C. Such an arrangement is provided in some flash memory systems for data retention. If a memory cell programmed to state B were to lose negative charge over time for example, it may be beneficial to position Vrb1 at a level closer to state A. If the charge of the cell decreases sufficiently that the cell's threshold voltage falls below Vrb1, the cell may be misread as in state A. Accordingly, some implementations may position the read reference voltage levels closer to the lower state to overcome such mis-reads.

If the margined read reference voltage levels for reading the neighboring word line are margined relative to the levels used at WLn, a different type of mis-read may occur in some cases. A cell in a lower state may be mis-read as in a higher state. For example, if a value of Vrb2 is used that is shifted relative to Vrb1 when Vrb1 is positioned relatively close to the upper edge of the state A distribution, a state A cell may be misread as in state B. If the cell at WLn+2 neighboring the cell at WLn+1 is programmed to state C after programming the cell at WLn+1, the threshold voltage of the cell at WLn+1 may appear to increase because of negative charge coupling. Furthermore, the retention, etc. that is not desired to detect when reading at WLn may be desired to detect when reading at WLn+1 as described.

Accordingly, the embodiment of FIG. 29 margins the second set of read reference voltages relative to a mean threshold voltage corresponding to the two neighboring memory states. Vra2 is margined relative to the mean threshold voltage of states E and A, Vrb2 is margined relative to the mean threshold voltage of states A and B, and Vrc2 is margined relative to the mean threshold voltage of states B and C.

In one embodiment, the mean threshold voltages are determined based on the mean of the lower edge values of the threshold voltage distributions for the two neighboring states. The lower edge values correspond to the verify levels used during program verification and can be used to compute the mean values. For example, the mean threshold voltage Vmb may be calculated using the mean of the verify levels Vva and Vvb applied when programming states A and B, respectively. After the mean of the verify levels has been calculated, it can be offset by half the width of the lower threshold voltage distribution to determine the mean threshold voltage level (e.g., Vmb). In another embodiment, the mean threshold voltages are calculated based on the two neighboring read reference voltages. For example, the mean threshold voltage Vmb between states A and B may be calculated as the mean of the read reference voltages Vra and Vrb applied when reading those cells. In this case, the reference voltage levels are still margined relative to mean threshold voltage levels rather than a single threshold voltage level corresponding to a particular state. In one embodiment, the read reference voltages are margined with respect to a midpoint between the upper edge of a first distribution (e.g. state A) and the lower edge of a second distribution (e.g., state B).

In one embodiment, the second set of read reference voltages are established on the basis of the change in Vread between a program verify operation and read operation. The read reference voltage for a particular state can be set to a value equal to the mean threshold voltage of the neighboring states minus a compensating margin based on ΔVread.

The compensating margin is determined as follows in one implementation. Equation 2 sets forth the relationship between a change in Vread and a change in the apparent threshold voltage of a given memory cell.

$$\Delta VTn = -\Delta Vread \frac{r2 + r1Crn + 1}{Crn} + \Delta VTn + 1 \frac{r1Crn + 1}{Crn} \quad \text{Equation 2}$$

The change in threshold voltage ΔVTn of a given memory cell at WLn is based on two components: the change in the read pass voltage ΔVread applied to the cell's neighbor and the change in threshold voltage of that neighbor ΔVTn+1. More specifically, the change is equal to the difference between the capacitive coupling effects associated with ΔVTn (which increases threshold voltage based on negative charge coupling) and the capacitive coupling effects associated with ΔVread (which decreases threshold voltage based on positive charge coupling).

In order to derive an appropriate margining value corresponding to the change in Vread, ΔVTn+1 can be set to 0, corresponding to no change in VT at the WLn+1 memory cell. Using the known change in Vread, a margining value can be set equal to the calculated value of ΔVTn to directly offset the change in apparent threshold voltage when reading the drain side neighboring word line.

Consider a read operation for a selected word line WLn in which information from the drain side neighboring word line WLn+1 is to be used to apply a compensation when reading WLn. When word line WLn+1 was verified during programming, its drain side neighboring word line WLn+2 was subjected to the low read pass voltage Vreadp (e.g., Vread4). Assume Vreadp is about 3.0V. Now when reading WLn+1 as part of the operation for WLn, the read pass voltage Vread1 is applied to WLn+2 to ensure conduction of every memory cell thereon. Assume Vread1 is about 5.5V such that ΔVread is 2.5V. Assume further that the values of r1, r2, and Cm (Cm+1) are 0.02, 0.03, and 0.5, respectively. Setting n and n+1 from equation 2 to n+1 and n+2, respectively, and setting ΔVTn+2 equal to zero, we obtain Equation 3. The amount of margining when reading WLn+1 can be determined from Equation 3.

$$\Delta VTn + 1 = -\Delta Vread \frac{r2 + r1Crn + 2}{Crn + 1} \quad \text{Equation 3}$$

Equation 3 provides the amount of apparent change in threshold voltage that may be expected for a memory cell on WLn+1 from the time of programming to the time of reading, based on a change in Vread. If the read reference voltage levels applied when reading WLn+1 account for this apparent change, a more accurate read operation may be achieved. If we substitute the assumed values from above into Equation 3, we see that the expected change in VT at WLn+1 based on ΔVread is about −0.2V. Thus, a compensating read margin of −0.2 is obtained.

As previously described, the margin can be used to margin the read reference voltages for reading a neighboring word line in different ways. In one embodiment, a read reference voltage is set to a value equal to the mean of the two neighboring states' program verify voltages plus the compensating margin. Assume a four state (E, A, B, C) device having corresponding verify levels Vva, Vvb, and Vvc equal to 0.8V, 1.6V, and 3.6V, respectively. The state A reference voltage Vra2 can be maintained at 0V (not margined). The state B reference voltage Vrb2 can be set to 1.0V: equal to ((0.8+1.6)/2)−0.2. The state C reference voltage can be set to 2.4V: equal to ((1.6+3.6)/2)−0.2. It will be appreciated that the aforementioned values are exemplary and will vary by implementation.

In another embodiment, a read reference voltage can be set to a value equal to the mean of the two neighboring states' nominal read reference voltages plus the compensating margin. In yet another embodiment, a read reference voltage can be set to a value equal to the mean of the average threshold voltage of the two neighboring states plus the compensating margin. One embodiment applies the compensating margin directly to the nominal read reference voltages without calculating mean values as described.

In the example above, no margin is provided at the state A reference voltage level. In other embodiments a margin is also provided at this level. Several reasons for not margining the state A read reference voltage may exist in various implementations. It is often difficult to provide the negative voltage that may be required to margin down a state reference voltage. Moreover, providing accurate small positive voltages near 0V is sometimes difficult. Additionally, since the threshold voltage of state A cells are close to charge neutral, they do not experience significant retention loss. Thus, the nominal read reference voltage at state can be used without adverse effects from retention losses. Finally, small increment values are often used for the program voltage pulses when programming state A which leads to precise levels of programming.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
a plurality of non-volatile storage elements; and
managing circuitry in communication with said plurality of non-volatile storage elements that performs a read process for a selected non-volatile storage element connected to a selected word line, said managing circuitry applies a read voltage corresponding to a particular state to an unselected non-volatile storage element at a first voltage level to determine a state of said unselected non-volatile storage element, applies said read voltage to said selected non-volatile storage element at a second voltage level during said read process, uses a particular voltage for said unselected non-volatile storage element when applying said read voltage to said selected non-volatile storage element based on said state of said unselected non-volatile storage element, and senses a condition of said selected non-volatile storage element during said read process, said first voltage level is lower than said second voltage level.

2. The non-volatile memory system of claim 1, wherein:
said unselected non-volatile storage element is connected to a first word line;
said selected word line is adjacent to said first word line in a first direction;
said managing circuitry programs non-volatile storage elements connected to said first word line to said particular state and verifies programming of said non-volatile storage elements connected to said first word line while applying a first pass voltage to a second word line, said second word line is adjacent to said first word line in a second direction, said managing circuitry applies a second pass voltage to said second word line while applying said read voltage to said unselected non-volatile storage element to determine said state of said unselected non-volatile storage element.

3. The non-volatile memory system of claim 2, wherein said managing circuitry:
provides said read voltage at said first voltage level to at least partially compensate for an apparent change in threshold voltage of said unselected non-volatile storage element resulting from a difference between said first pass voltage and said second pass voltage.

4. The non-volatile memory system of claim 2, wherein:
applying said second pass voltage increases an apparent threshold voltage of said unselected non-volatile storage element;
a mean threshold voltage level corresponds to said particular state and a different state, said different state is adjacent to said particular state;
said first voltage level of said read voltage is based on said mean threshold voltage level and said increase in said apparent threshold voltage.

5. The non-volatile memory system of claim 4, wherein:
said mean threshold voltage level is based on a mean of a first verify level used when programming to said particular state and a second verify level used when programming to said different state, said mean is offset by half a width of a threshold voltage distribution of said different state, said different state is lower than said particular state.

6. The non-volatile memory system of claim 5, wherein:
said mean threshold voltage level is determined during a characterization of one or more non-volatile memory devices.

7. The non-volatile memory system of claim 6, wherein said characterization is performed so as to determine said mean threshold voltage level before a threshold voltage of memory cells of said one or more non-volatile memory devices shift due to retention loss and relaxation.

8. The non-volatile memory system of claim 4, wherein:
said mean threshold voltage level is a midpoint between a lowest threshold voltage of said particular state and a highest threshold voltage of a different state, said different state is adjacent to said particular state, said highest threshold voltage of said different state is lower than said lowest threshold voltage of said particular state.

9. The non-volatile memory system of claim 1, wherein:
said first voltage level is margined with respect to said second voltage level.

10. The non-volatile memory system of claim 9, wherein:
said first voltage level is margined with respect to a mean threshold voltage level corresponding to said particular state and a different state, said different state having a threshold voltage range adjacent to said particular state, said first and second voltage levels of said read voltage are between a threshold voltage range of said particular state and said threshold voltage range of said different state.

11. The non-volatile memory system of claim 1, wherein:
said managing circuitry using a particular voltage for said unselected non-volatile storage element comprises applying multiple voltages to said unselected non-volatile storage element while applying said read voltage to said selected non-volatile storage element, one of said multiple voltages is said particular voltage, said managing circuitry senses said condition of said selected non-volatile storage element in response to said particular voltage.

12. The non-volatile memory system of claim 1, wherein:
said unselected non-volatile storage element and said selected non-volatile storage element are multi-state flash memory cells;
said read voltage is a first read voltage and said applying said first read voltage further includes applying a plurality of read voltages including said first read voltage to determine which state said unselected non-volatile storage element is in;
said managing circuitry using said particular voltage for said unselected non-volatile storage element comprises applying multiple voltages to said unselected non-volatile storage element including one voltage for each state said unselected non-volatile storage element can be programmed to, one of said multiple voltages is said particular voltage, said particular voltage is associated with said state said neighbor is programmed to;
said managing circuitry discards data sensed in response to voltages of said multiple voltages that are not associated with said state said unselected non-volatile storage element is programmed to; and
said managing circuitry senses said condition of said selected non-volatile storage element in response to said particular voltage.

13. The non-volatile memory system of claim 1, wherein said managing circuitry reports data based on said condition.

14. The non-volatile memory system of claim 1, wherein:
said selected non-volatile storage element is a multi-state flash memory device that stores at least two bits of data programmed into said selected non-volatile storage element using full sequence programming.

15. The non-volatile memory system of claim 1, wherein:
said selected non-volatile storage element is a multi-state flash memory cell that stores at least two bits of data programmed into a first page and a second page;
said selected non-volatile storage element is capable of being in a first state, a second state, a third state or a fourth state;
said read voltage is a first read voltage between said third state and said fourth state, said particular state is said fourth state;
said managing circuitry applies said read voltage to said selected non-volatile storage element, uses said particular voltage, and senses said condition as part of a process of reading said first page using said first read voltage; and
said managing circuitry further senses a condition of said selected non-volatile storage element in response to a second read voltage without regard to said condition of said unselected non-volatile storage element, said second read voltage is between said first state and said second state.

16. The non-volatile memory system of claim 15, wherein:
said managing circuitry applies said second read voltage at a third voltage level as part of determining said condition of said unselected non-volatile storage element;
wherein sensing said condition of said selected non-volatile storage element includes applying said second read voltage at said third voltage level to said selected non-volatile storage element.

17. The non-volatile memory system of claim 1, wherein:
said selected non-volatile storage element includes data programmed with respect to a second grouping of data subsequent to writing to neighboring non-volatile storage elements for a first grouping of data.

18. The non-volatile memory system of claim 1, wherein:
said selected non-volatile storage element and said unselected non-volatile storage element are NAND flash memory cells.

19. The non-volatile memory system of claim 1, wherein:
said selected non-volatile storage element and said unselected non-volatile storage element are multi-state flash memory cells.

20. The non-volatile memory system of claim 1, wherein:
said managing circuitry includes at least one of a controller and a state machine.

21. A non-volatile memory system, comprising:
a plurality of non-volatile storage elements including a first non-volatile storage element, a second non-volatile storage element, and a third non-volatile storage element, said second non-volatile storage element is adjacent to said first non-volatile storage element in a first direction, said third non-volatile storage element is adjacent to said first non-volatile storage element in a second direction; and
managing circuitry in communication with said plurality of non-volatile storage elements, said managing circuitry provides a first pass voltage to said first non-volatile storage element when verifying programming of said second non-volatile storage element, provides a second pass voltage to said first non-volatile storage element when determining a current condition of said second non-volatile storage element during a read process for said third non-volatile storage element, provides a first read voltage corresponding to a particular state to said second non-volatile storage element when determining said current condition, and provides a second read voltage corresponding to said particular state to said third non-volatile storage element to determine a condition of said third non-volatile storage element during said read process, said first read voltage is based on a difference between said first pass voltage and said second pass voltage, said first read voltage is lower than said second read voltage.

22. The non-volatile memory system of claim 21, wherein:
said managing circuitry providing said second pass voltage decreases an apparent threshold voltage of said second non-volatile storage element;
said managing circuitry providing said first read voltage at least partially compensates for said decrease in said apparent threshold voltage.

23. The non-volatile memory system of claim 21, wherein:
said managing circuitry provides said first read voltage at a particular level that is offset from said second read voltage based on said difference between said first pass voltage and said second pass voltage.

24. The non-volatile memory system of claim 21, wherein:
said managing circuitry provides said first read voltage at a level corresponding to said difference and a mean threshold voltage associated with said particular state and a different state adjacent to said particular state.

25. The non-volatile memory system of claim 24, wherein:
said level is offset from said mean threshold voltage based on an amount of charge coupling resulting from said difference.

26. The non-volatile memory system of claim 21, wherein:
said first, second, and third non-volatile storage elements are NAND multi-state flash memory devices.

27. A non-volatile memory system, comprising:
a plurality of non-volatile storage elements; and
managing circuitry in communication with said plurality of non-volatile storage elements, said managing circuitry applies a first read compare voltage corresponding to a first state to an unselected non-volatile storage element as part of reading a selected non-volatile storage element that neighbors said unselected non-volatile storage element, applies a second read compare voltage corresponding to said first state to said selected non-volatile storage element being read, applies a first read pass voltage to said unselected non-volatile storage element, applies a second read pass voltage to a different unselected non-volatile storage element, and senses a condition of said selected non-volatile storage element being read while applying said first read pass voltage and said second read pass voltage, said first read compare voltage is lower than said second read compare voltage.

28. The non-volatile memory system of claim 27, wherein:
said managing circuitry applies said first read compare voltage, said second read compare voltage, said first read pass voltage, said second read pass voltage and senses said condition in response to a request to read data from said selected non-volatile storage element; and
said managing circuitry applies said second read compare voltage corresponding to said first state to said unselected word line during a different read process performed in response to a request to read data from said unselected non-volatile storage element.

29. The non-volatile memory system of claim 27, wherein:
said managing circuitry senses charge level information about said unselected non-volatile storage element while applying said first read compare voltage;
said managing circuitry determines data stored in said selected non-volatile storage element being read based on said condition of said selected non-volatile storage element being read and said charge level information about said unselected non-volatile storage element connected to said unselected word line.

30. The non-volatile memory system of claim 27, wherein:
said managing circuitry senses charge level information about said unselected non-volatile storage element while applying said first read compare voltage;
said managing circuitry performs additional iterations of applying said read compare voltage at said second level to said selected word line, applying said first read pass voltage, applying said second read pass voltage, and sensing said condition of said selected non-volatile storage element, wherein performing additional iterations includes varying said first read pass voltage during different iterations; and
said managing circuitry determines data stored in said selected non-volatile storage element being read based on one of said iterations associated with said charge level information about said unselected non-volatile storage element connected to said unselected word line.

31. The non-volatile memory system of claim 27, wherein:
said managing circuitry determines that said second non-volatile storage element is programmed and applies said second pass voltage in response to determining that said second non-volatile storage element is programmed.

* * * * *